(12) United States Patent
Mizuta

(10) Patent No.: US 12,125,740 B2
(45) Date of Patent: Oct. 22, 2024

(54) IMAGING DEVICE, METHOD OF MANUFACTURING IMAGING DEVICE, AND ELECTRONIC DEVICE

(71) Applicant: SONY GROUP CORPORATION, Tokyo (JP)

(72) Inventor: Kyohei Mizuta, Kanagawa (JP)

(73) Assignee: SONY GROUP CORPORATION, Tokyo (JP)

(*) Notice: Subject to any disclaimer, the term of this patent is extended or adjusted under 35 U.S.C. 154(b) by 0 days.

(21) Appl. No.: 18/500,386

(22) Filed: Nov. 2, 2023

(65) Prior Publication Data

US 2024/0063054 A1  Feb. 22, 2024

Related U.S. Application Data

(63) Continuation of application No. 17/453,924, filed on Nov. 8, 2021, now Pat. No. 11,830,766, which is a
(Continued)

(30) Foreign Application Priority Data

Mar. 31, 2016 (JP) ................. 2016-070058

(51) Int. Cl.
*H01L 21/768* (2006.01)
*H01L 21/822* (2006.01)
(Continued)

(52) U.S. Cl.
CPC .......... *H01L 21/768* (2013.01); *H01L 21/822* (2013.01); *H01L 27/04* (2013.01);
(Continued)

(58) Field of Classification Search
CPC ..... H01L 21/768; H01L 21/822; H01L 27/04; H01L 27/146; H04N 25/57; H04N 25/76
See application file for complete search history.

(56) References Cited

U.S. PATENT DOCUMENTS

2003/0183862 A1  10/2003  Jin et al.
2006/0267098 A1* 11/2006 Fujimaki ................. H01L 28/91
257/350
(Continued)

FOREIGN PATENT DOCUMENTS

CN  101835003 A  9/2010
CN  103247642 A  8/2013
(Continued)

OTHER PUBLICATIONS

Non-Final Office Action issued in U.S. Appl. No. 17/456,664 dated Feb. 9, 2023.
(Continued)

*Primary Examiner* — Shih Tsun A Chou
(74) *Attorney, Agent, or Firm* — CHIP LAW GROUP

(57) ABSTRACT

The present technology relates to an imaging device capable of preventing a decrease of sensitivity of the imaging device in a case where a capacitance element is provided in a pixel, a method of manufacturing an imaging device, and an electronic device. The imaging device includes, in a pixel, a photoelectric conversion element and a capacitance element accumulating an electric charge generated by the photoelectric conversion element. The capacitance element includes a first electrode including a plurality of trenches, a plurality of second electrodes each having a cross-sectional area smaller than a contact connected to a gate electrode of a transistor in the pixel, and buried in each of the trenches, and a first insulating film disposed between the first electrode and the second electrode in each of the trenches. The present technology can be applied, for example, to a backside irradiation-type CMOS image sensor.

10 Claims, 30 Drawing Sheets

Related U.S. Application Data continuation of application No. 16/087,275, filed as application No. PCT/JP2017/010863 on Mar. 17, 2017, now Pat. No. 11,189,520.

(51) Int. Cl.

| | | |
|---|---|---|
| *H01L 27/04* | (2006.01) | |
| *H01L 27/146* | (2006.01) | |
| *H04N 25/57* | (2023.01) | |
| *H04N 25/621* | (2023.01) | |
| *H04N 25/76* | (2023.01) | |

(52) U.S. Cl.
CPC ...... *H01L 27/146* (2013.01); *H01L 27/14603* (2013.01); *H01L 27/14612* (2013.01); *H01L 27/14656* (2013.01); *H04N 25/57* (2023.01); *H04N 25/621* (2023.01); *H04N 25/76* (2023.01)

(56) References Cited

U.S. PATENT DOCUMENTS

| | | |
|---|---|---|
| 2010/0230579 A1 | 9/2010 | Watanabe |
| 2010/0238334 A1 | 9/2010 | Takahashi |
| 2013/0200479 A1 | 8/2013 | Sakano et al. |
| 2013/0214371 A1 | 8/2013 | Asatsuma et al. |
| 2013/0292841 A1 | 11/2013 | Lai et al. |
| 2014/0151531 A1* | 6/2014 | Yamashita ............ H04N 25/76 257/435 |
| 2015/0168841 A1 | 6/2015 | Matsunaga et al. |

FOREIGN PATENT DOCUMENTS

| | | |
|---|---|---|
| CN | 103650479 A | 3/2014 |
| JP | 64-010664 A | 1/1989 |
| JP | 07-111312 A | 4/1995 |
| JP | 2000-138344 A | 5/2000 |
| JP | 20002-222924 A | 8/2002 |
| JP | 2006-332514 A | 12/2006 |
| JP | 2009-165186 A | 7/2009 |
| JP | 2010-213140 A | 9/2010 |
| JP | 2013-161945 A | 8/2013 |
| JP | 2013-207321 A | 10/2013 |
| JP | 2015-115599 A | 6/2015 |

OTHER PUBLICATIONS

Richard C. Jaeger, "Introduction to Microelectronic Fabrication", Addison-Weley Modular Series on Solid State Devices, 1993, p. 138.

Zheng, et al., "Wafer level high-density trench capacitors by using a two-step trench-filing process", Microsystem Technologies, vol. 23, No. 2, Feb. 1, 2017, pp. 399-404 published on Sep. 23, 2015.

Electrical resistivity and conductivity, Wikipedia, 2015.

International Search Report and Written Opinion of PCT Application No. PCT/JP2017/010863, issued on Apr. 11, 2017, 10 pages of English Translation and 09 pages of ISRWO.

International Preliminary Report on Patentability of PCT Application No. PCT/JP2017/010863, issued on Oct. 11, 2018, 10 pages of English Translation and 06 pages of IPRP.

Non-Final Office Action for U.S. Appl. No. 16/087,275, issued on Jan. 11, 2021, 09 pages.

Non-Final Office Action for U.S. Appl. No. 16/087,275, issued on Feb. 27, 2020, 10 pages.

Final Office Action for U.S. Appl. No. 16/087,275, issued on May 27, 2021, 12 pages.

Final Office Action for U.S. Appl. No. 16/087,275, issued on Jul. 23, 2020, 09 pages.

Advisory Action for U.S. Appl. No. 16/087,275, issued on Oct. 6, 2020, 02 pages.

Notice of Allowance for U.S. Appl. No. 16/087,275, issued on Aug. 4, 2021, 08 pages.

Notice of Allowance for U.S. Appl. No. 17/453,924, issued on Sep. 29, 2023, 02 pages.

Notice of Allowance for U.S. Appl. No. 17/453,924, issued on Aug. 11, 2023, 02 pages.

Notice of Allowance for U.S. Appl. No. 17/453,924, issued on Jul. 26, 2023, 08 pages.

Non-Final Office Action for U.S. Appl. No. 17/453,924, issued on Mar. 9, 2023, 13 pages.

Notice of Allowance for U.S. Appl. No. 17/456,664 dated Jun. 13, 2023.

Sekine, et al., "Deep Subhalf-Micron Contact Filling Technology Using Control Etching and Collimated Ti Sputtering Techniques", The Electrochemical Society Inc., vol. 142, No. 2, Feb. 1995, pp. 664-668.

* cited by examiner

IMAGING DEVICE, METHOD OF MANUFACTURING IMAGING DEVICE, AND ELECTRONIC DEVICE

CROSS REFERENCE TO RELATED APPLICATIONS

The present application is a continuation application of U.S. patent application Ser. No. 17/453,924, filed on Nov. 8, 2021, which is a continuation application of U.S. patent application Ser. No. 16/087,275, now U.S. Pat. No. 11,189, 520, filed Sep. 21, 2018, which is a U.S. National Phase of International Patent Application No. PCT/JP2017/010863, filed Mar. 17, 2017, which claims priority benefit of Japanese Priority Patent Application No. JP 2016-070058 filed in the Japan Patent Office on Mar. 31, 2016, the entire content of which is hereby incorporated by reference. Each of the above-referenced applications is hereby incorporated herein by reference in its entirety.

TECHNICAL FIELD

The present technology relates to an imaging device, a method of manufacturing an imaging device, and an electronic device. In particular, the present technology relates to an imaging device that is preferably used in providing a capacitance element for accumulating electric charges in pixels, a method of manufacturing an imaging device, and an electronic device.

BACKGROUND ART

An imaging device capable of enlarging a dynamic range of an imaging device by providing in pixels a capacitance element that accumulates electric charges overflowing from a photo diode has been proposed (e.g., see Patent Document 1).

CITATION LIST

Patent Document

Patent Document 1: Japanese Patent Application Laid-Open No. 2005-328493

SUMMARY OF THE INVENTION

Problems to be Solved by the Invention

Providing the capacitance element in the pixel, however, correspondingly decreases a light receiving area of the photo diode, causing the decrease of sensitivity of the imaging device.

Thus, the present technology aims to prevent the decrease of sensitivity of the imaging device in a case where the capacitance element is provided in the pixel.

Solutions to Problems

In a first aspect of the present technology, an imaging device includes, in a pixel: a photoelectric conversion element; and a capacitance element configured to accumulate electric charges generated by the photoelectric conversion element, in which the capacitance element includes a first electrode including a plurality of first trenches, a plurality of second electrodes each having a cross-sectional area smaller than a contact connected to a gate electrode of a transistor in the pixel and buried in each of the first trenches, and a first insulating film disposed between the first electrode and the second electrode in each of the first trenches.

The first electrode can be disposed at a position vertically overlapping the photoelectric conversion element in a wiring layer disposed opposite to an incidence surface of the photoelectric conversion element.

The first electrode can be connected to a negative power supply side of the pixel, while each of the second electrodes can be connected to a positive power supply side of the pixel.

The first electrode can be connected to a positive power supply side of the pixel, while each of the second electrodes can be connected to a negative power supply side of the pixel.

The first electrode can be disposed at a position not vertically overlapping the photoelectric conversion element.

The first electrode can be disposed in a semiconductor substrate in which the photoelectric conversion element is disposed.

The capacitance element includes a plurality of second trenches, and further includes a third electrode disposed at a position vertically overlapping the first electrode in a wiring layer stacked on the semiconductor substrate and electrically connected to each of the second electrodes, and a plurality of fourth electrodes each having a cross-sectional area smaller than the cross-sectional area of the contact, buried in each of the second trenches, and electrically connected to the first electrode, and a second insulating film disposed between the third electrode and the fourth electrode in each of the second electrodes.

The first electrode can be disposed at the wiring layer.

In the semiconductor substrate in which the photoelectric conversion element is disposed, the third electrode disposed at a position vertically overlapping the first electrode and electrically connected to each of the second electrodes, and the second insulating film disposed between the first electrode and the second electrode can further be provided.

A total area of a portion where each of the second electrodes faces the first electrode can be made to be larger than an area of a region where the second electrodes are disposed in the first electrode.

Each of the first trenches can be formed by directed self assembly lithography.

In a second aspect of the present technology, a method of manufacturing an imaging device includes: a first electrode forming step of forming a first electrode in a pixel; a trench forming step of forming a plurality of trenches in the first electrode, each trench having an opening area smaller than an opening are of a trench for forming a contact connected to a gate electrode of a transistor in the pixel; an insulating film forming step of forming an insulating film on an inner surface of each of trenches; and a second electrode forming step of burying a second electrode in each of the trenches.

In the first electrode forming step, the first electrode can be formed at a position vertically overlapping the photoelectric conversion element in a wiring layer disposed on the side opposite to an incidence surface side of the photoelectric conversion element in the pixel.

In the first electrode forming step, the first electrode can be formed at a position not vertically overlapping the photoelectric conversion element in the pixel.

In the first electrode forming step, the first electrode can be formed in a semiconductor substrate in which the photoelectric conversion element is disposed.

In the first electrode forming step, the first electrode can be formed in the wiring layer.

A total area of a portion where each of the second electrodes faces the first electrode can be larger than an area of a region where the second electrode is disposed in the first electrode.

In the trench forming step, each trench can be formed by directed self assembly lithography.

In a third aspect of the present technology, an electronic device includes: an imaging device; and a signal processing unit configured to process a signal output from the imaging device, in which the imaging device includes, in a pixel, a photoelectric conversion element, and a capacitance element configured to accumulate an electric charge generated by the photoelectric conversion element, and the capacitance element includes a first electrode in which a plurality of trenches are formed, a plurality of second electrodes each having a cross-sectional area smaller than a contact connected to a gate electrode of a transistor in the pixel and buried in each of the trenches, and an insulating film disposed between the first electrode and the second electrode in each of the trenches.

In the first aspect of the present technology, an electric charge generated by the photoelectric conversion element is accumulated in the capacitance element including the first electrode in which the plurality of first trenches are provided, the plurality of second electrodes each having a cross-sectional area smaller than the contact connected to a gate electrode of a transistor in the pixel and buried in each of the first trenches, and the capacitance element including the first insulating film disposed between the first electrode and the second electrode in each of the first trenches.

In the second aspect of the present technology, the first electrode is formed in the pixel, the plurality of trenches each having the opening area smaller than the opening area of the trench for forming the contact connected to the gate electrode of the transistor in the pixel is formed in the first electrode, the insulating film is formed on the inner surface of each of the trenches and the second electrode is buried in each of the trenches.

In the third aspect of the present technology, the electric charge generated by the photoelectric conversion element is accumulated in the capacitance element including the first electrode including the plurality of trenches, the plurality of second electrodes each having the cross-sectional area smaller than the contact connected to the gate electrode of the transistor in the pixel and buried in each of the trenches, and the first insulating film disposed between the first electrode and the second electrode in each of the trenches.

Effects of the Invention

According to the first to third aspects of the present technology, the decrease of sensitivity of the imaging device can be prevented in a case in which the capacitance element is provided in the pixel.

Note that the effects recited herein are not particularly limited, and any effect mentioned in the present disclosure may be obtained.

MODE FOR CARRYING OUT THE INVENTION

An embodiment for implementing the invention (referred to as an embodiment hereinafter) will be described in detail below by referring to the accompanying drawings. Note that the description will be given in the following order:

1. Imaging Device to which Present Technology is Applied

2. First Embodiment (First example in which a capacitance element is provided in a region vertically overlapping a photoelectric conversion element is provided)
3. Second Embodiment (Second example in which a capacitance element is provided in a region vertically overlapping a photoelectric conversion element).
4. Third Embodiment (Third example in which a capacitance element is provided in a region vertically overlapping a photoelectric conversion element).
5. Fourth Embodiment (First example in which a capacitance element is provided in a region not vertically overlapping a photoelectric conversion element).
6. Fifth Embodiment (Second Example in which a capacitance element is provided in a region not vertically overlapping a photoelectric conversion element)
7. Sixth Embodiment (Third example in which a capacitance element is provided in a region not vertically overlapping a photoelectric conversion element).
8. Modification
9. Usage Example of a Solid State Imaging Device.

1. Imaging Device to which Present Technology is Applied

Figure 1:
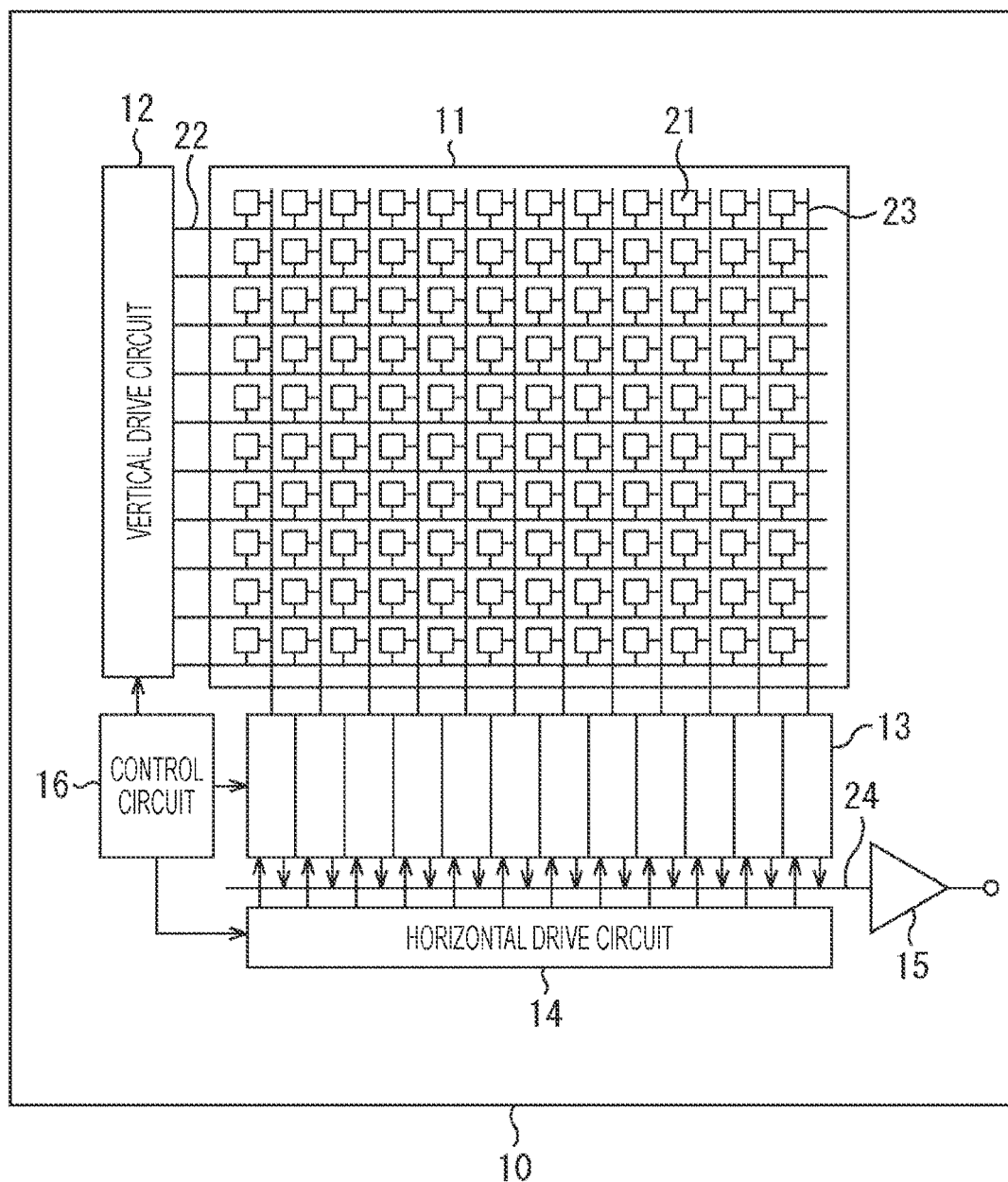
FIG. 1 illustrates an exemplary structure of an imaging device to which the present technology is applied.
Figure 2:
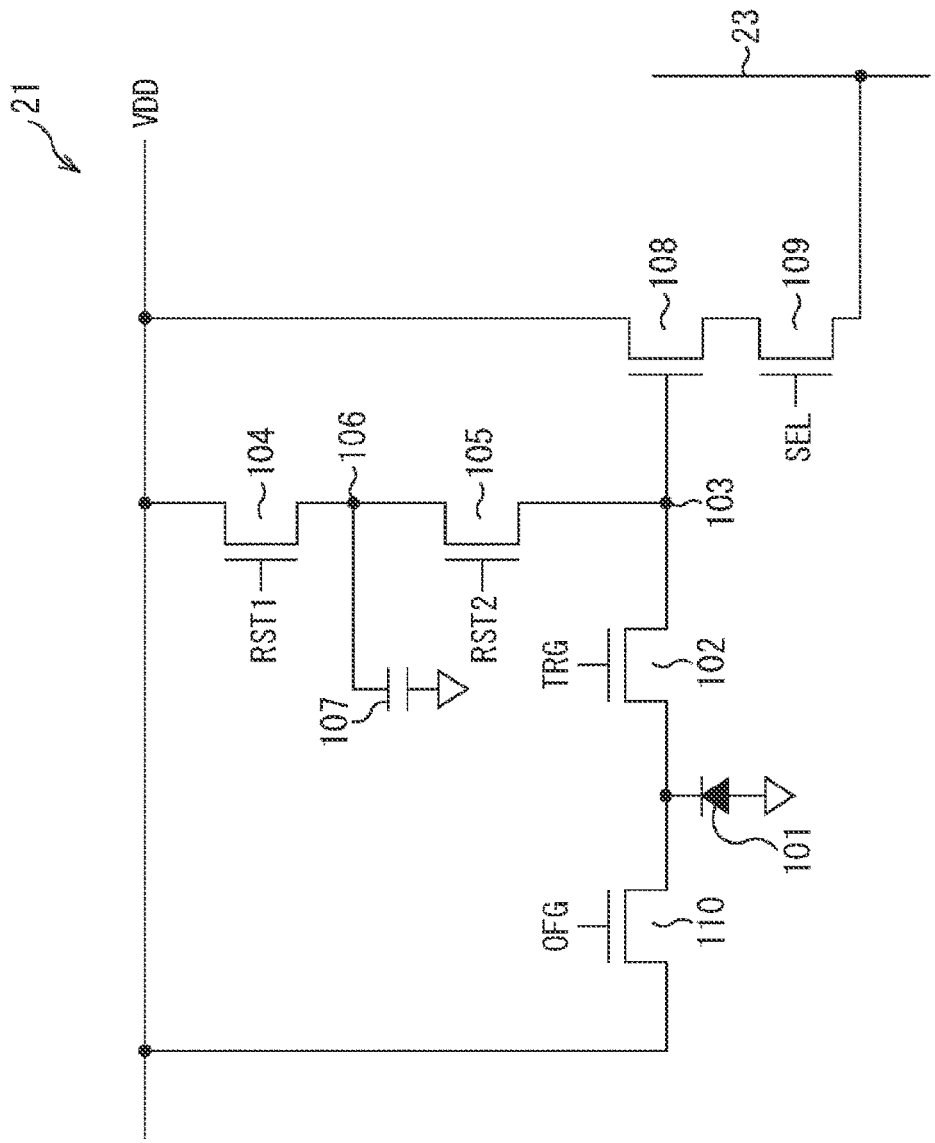
FIG. 2 is a circuit diagram illustrating a first exemplary configuration of a pixel of the imaging device of FIG. 1.
Figure 3:
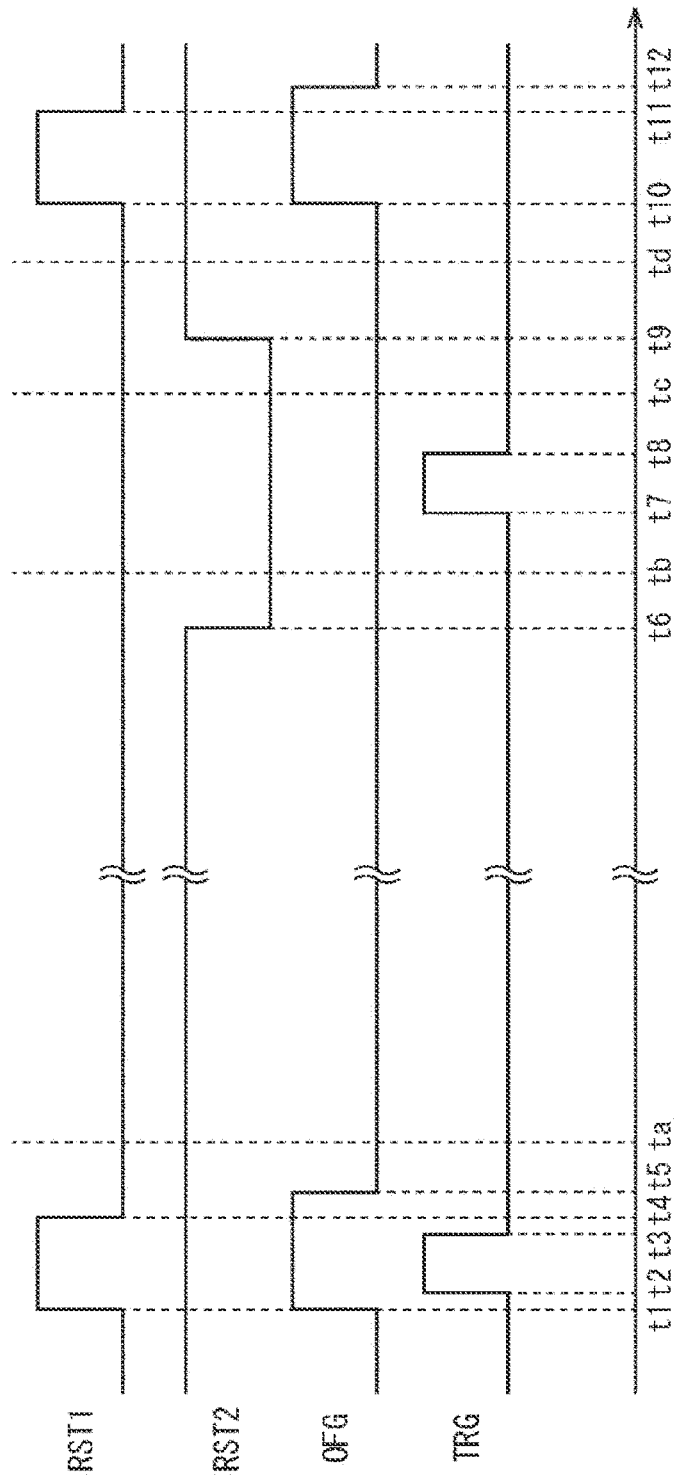
FIG. 3 is a timing chart for explaining an operation of a pixel of FIG. 2.

First, by referring to FIGS. 1 to 3, an exemplary structure of an imaging device to which the present technology is applied is described.

FIG. 1 is a block diagram illustrates an exemplary structure of an imaging device 10 to which the present technology is applied.

The imaging device 10 includes a pixel region 11, a vertical drive circuit 12, a column signal processing circuit 13, a horizontal drive circuit 14, an output circuit 15, and a control circuit 16.

The pixel region 11 is a light receiving surface that receives light collected by an optical system which is not illustrated. The pixel region 11 includes a plurality of pixels 21 arranged in a matrix manner, with each pixel 21 connected to the vertical drive circuit 12 for each row via a horizontal signal line 22 and to the column signal processing circuit 13 for each column via a vertical signal line 23. The plurality of pixels 21 individually outputs a pixel signal having a level corresponding to the amount of light each pixel 21 receives, thus rendering an image of an object according to the pixel signals on the pixel region 11.

The vertical drive circuit 12 supplies a drive signal to the pixel 21 to drive (i.e., transfer, select, or reset) each pixel 21 via the horizontal signal lines 22 sequentially for each line of the plurality of pixels 21 arranged in the pixel region 11. For example, the vertical drive circuit 12 controls exposure time, reading scanning, and the like of each pixel 21 in the pixel region 11. Furthermore, the vertical drive circuit 12 carries out, as described later, reading scanning, for example, of the pixel signal of each pixel 21 in the pixel region 11 for multiple pixels in parallel, while controlling timing for changing reading lines for each reading scanning in accordance with the position of the reading line for other reading scanning.

The column signal processing circuit 13 performs correlated double sampling (CDS) processing on a pixel signal output from the plurality of pixels 21 via the vertical signal line 23, thus carrying out AD conversion of the pixel signals and removing reset noise. For example, the column signal processing circuit 13 includes a plurality of column processing units (not illustrated) corresponding to the number of columns of the pixels 21 so as to perform CDS processing in parallel for each row of the pixel 21.

The horizontal drive circuit 14 supplies a drive signal to the column signal processing circuit 13 sequentially for each column of the plurality of pixels 21 disposed in the pixel region 11, the drive signal serving to output the pixel signal from the column signal processing circuit 13 to an output signal line 24.

The output circuit 15 amplifies the pixel signal supplied from the column signal processing circuit 13 via the output signal line 24 at timing in accordance with the drive signal of the horizontal drive circuit 14, and outputs the amplified pixel signal to the subsequent stage of the output circuit.

The control circuit 16 controls each part of the imaging device 10. For example, the control circuit 16 generates a clock signal in accordance with a driving cycle of each part and supplies the clock signal to each part.

FIG. 2 is a circuit diagram illustrating an exemplary configuration of the pixel 21 arranged in the pixel region 11 of the imaging device 10.

The pixel 21 includes a photoelectric conversion element 101, a transfer gate 102, a floating diffusion (FD) unit 103, a first reset gate 104, a second reset gate 105, a node 106, a capacitance element 107, an amplifying transistor 108, a selecting transistor 109, and an overflow gate 110.

The imaging device 10 to which the present technology is applied has, for example, a characteristic in which the capacitance element 107 is provided in the pixel 21. Since the capacitance element 107 is provided in the pixel 21, the imaging device 10 can carry out a global shutter shooting operation to transfer electric charges generated by the photoelectric conversion element 101 of each pixel 21 simultaneously to the capacitance element 107, and accumulate the transferred electric charges, for example. Furthermore, the imaging device 10, for example, can carry out a wide dynamic range shooting operation in which the electric charge overflowing from the photoelectric conversion element 101 is accumulated in the capacitance element 107 in a case where an excessive amount of light enters the photoelectric conversion element 101, and the overflowing electric charge is also used as image data.

Furthermore, a plurality of signal lines is laid for the pixel 21, for example, for each pixel line as the horizontal signal line 22 of FIG. 1. Then, drive signals TRG, RST1, RST2, SEL, and OFG are supplied from the vertical drive circuit 12 of FIG. 1 via a plurality of signal lines. These drive signals enter an active state at a high level (e.g., supply voltage VDD) and enter a non-active state at a low level (e.g., supply voltage VSS), because each of the transistors of the pixels 21 is NMOS transistor.

Note that, in the following, the drive signal being in the active state will also be referred to as the drive signal being turned on, and the drive signal being in the non-active state will also be referred to as the drive signal being turned off.

The photoelectric conversion element 101 includes, for example, a photodiode having a PN junction. The photoelectric conversion element 101 generates and accumulates the electric charge corresponding to the received light amount.

The transfer gate 102 is connected between the photoelectric conversion element 101 and the FD unit 103. The drive signal TRG is applied to the gate electrode of the transfer gate 102. When the drive signal TRG is turned on, the transfer gate 102 enters the conductive state, and the electric charge accumulated in the photoelectric conversion element 101 is transferred to the FD unit 103 via the transfer gate 102.

Furthermore, an overflow path is formed under the gate electrode of the transfer gate 102. Then, even in a case where the transfer gate 102 is in the non-conductive state, the electric charge overflowing from the photoelectric conversion element 101 is transferred to the FD unit 103 via the overflow path of the transfer gate 102 if the electric charge amount of the photoelectric conversion element 101 exceeds a saturated electric charge amount.

The FD unit 103 converts the electric charge to a voltage signal by charge-voltage conversion and outputs the signal.

The first reset gate 104 is connected between a power supply VDD and the node 106. The drive signal RST1 is applied to the gate electrode of the first reset gate 104. When the drive signal RST1 is turned on, the first reset gate 104 enters the conductive state, and the potential of the node 106 is reset to the level of the supply voltage VDD.

The second reset gate 105 is connected between the FD unit 103 and the node 106. The drive signal RST2 is applied to the gate electrode of the second reset gate 105. When the drive signal RST2 is turned on, the second reset gate 105 enters the conductive state, coupling the potential of the FD unit 103, the node 106, and the capacitance element 107.

The capacitance element 107 is provided, for example, as a capacitor that accumulates the electric charge generated by the photoelectric conversion element 101. One electrode of the capacitance element 107 is connected to the node 106, while the opposite electrode is connected to the power supply VDD side which is a positive power supply of the pixel 21, or the power supply VSS (not illustrated) side which is a negative power supply of the pixel 21.

The amplifying transistor 108 has its gate electrode connected to the FD unit 103 and its drain electrode connected to the power supply VDD, thus acting as the reading circuit for reading the electric charge held in the FD unit 103, or acting as the input unit of a so-called source follower circuit. In other words, the amplifying transistor 108 has its source electrode connected to the vertical signal line 23 via the selecting transistor 109, thus forming a source follower circuit with a constant current source (not illustrated) connected to one end of the vertical signal line 23.

The selecting transistor 109 is connected between the source electrode of the amplifying transistor 108 and the vertical signal line 23. The drive signal SEL is applied to the gate electrode of the selecting transistor 109. When the drive signal SEL is turned on, the selecting transistor 109 enters the conductive state, and the pixel 21 enters a selectable state. Thus, the pixel signal output from the amplifying transistor 108 is output to the vertical signal line 23 via the selecting transistor 109.

The overflow gate 110 is connected between the power supply VDD and the photoelectric conversion element 101. The drive signal OFG is applied to the gate electrode of the overflow gate 110. When the drive signal OFG is turned on, the overflow gate 110 enters the conductive state, and the electric charge in the photoelectric conversion element 101 is discharged and the photoelectric conversion element 101 is reset.

In the following, note that the gate or the transistor entering the conductive state will also be referred to as the gate or the transistor being turned on, and that the gate or transistor entering the non-conductive state will also be referred to as the gate or the transistor being turned off.

Operation of Pixels 21

Next, the operation of the pixel 21 is described by referring to a timing chart of FIG. 3. Note that FIG. 3 illustrates a timing chart of the above-described wide dynamic range shooting operation as an example operation of the imaging device 10. Furthermore, FIG. 3 illustrates the timing charts of the drive signals RST1, RST2, OFG, and TRG.

This processing is carried out, for example, for each pixel row or several pixel rows of the pixel region 11 in a predetermined scanning order.

At time t1, the drive signals RST1 and OFG are turned on, and the first reset gate 104 and the overflow gate 110 are turned on. Furthermore, at time t1, the drive signal RST2 is turned on and the second reset gate 105 is turned on, achieving potential coupling among the FD unit 103, the node 106, and the capacitance element 107. Accordingly, in response to turning on of the first reset gate 104, the potential of a region where the potential coupling is achieved among the FD unit 103, the node 106, and the capacitance element 107 is reset to the level of the supply voltage VDD. Furthermore, when the overflow gate 110 is turned on, the electric charge accumulated in the photoelectric conversion element 101 is discharged via the overflow gate 110, whereby the overflow gate 101 is reset.

At time t2, the drive signal TRG is turned on, and the transfer gate 102 is turned on. This allows the electric charge left in the photoelectric conversion element 101 is transferred via the transfer gate 102 to the region where the potential coupling is achieved among the FD unit 103, the node 106, and the capacitance element 107.

At time t3, the drive signal TRG is turned off, and the transfer gate 102 is turned off.

At time t4, the drive signal RST1 is turned off, and the first reset gate 104 is turned off.

At time t5, the drive signal OFG is turned off, and the overflow gate 110 is turned off. Thus, accumulation of the electric charge to the photoelectric conversion element 101 starts, and the exposure period starts.

Then, at time to immediately after time t5, the drive signal SEL (not illustrated) is turned on, and the selecting transistor 109 is turned on. This allows a signal N2, which is based on the potential of the region where the potential coupling is achieved among the FD unit 103, the node 106, and the capacitance element 107, to be output to the vertical signal line 23 via the amplifying transistor 108 and the selecting transistor 109. The signal N2 is a signal which is based on the potential of the reset state of the region where the potential coupling is achieved among the FD unit 103, the node 106, and the capacitance element 107.

Thereafter, the drive signal SEL is turned off, and the reading of the signal N2 is stopped.

During exposure, the electric charge generated by the photoelectric conversion element 101 is accumulated in the photoelectric conversion element 101 until the photoelectric conversion element 101 is saturated. Meanwhile, the electric charge overflowing from the photoelectric conversion element 101 due to saturation of the photoelectric conversion element 101 because of strong incident light is transferred to the capacitance element 107 via the overflow path of the transfer gate 102 and the second reset gate 105. This allows the electric charge overflowed from the photoelectric conversion element 101 during the exposure period is accumulated in the capacitance element 107.

At time t6, the drive signal RST2 is turned off, and the second reset gate 105 is turned off.

Then, at time tb, which is between time t6 and time t7, the drive signal SEL (not illustrated) is turned on, and the selecting transistor 109 is turned on. Thus, a signal N1 which is based on the potential of the FD unit 103 is output to the vertical signal line 23 via the amplifying transistor 108 and the selecting transistor 109. The signal N1 is a signal which is based on the potential of the reset state of the FD unit 103.

Thereafter, the drive signal SEL is turned off, and reading of the signal N1 is stopped.

At time t7, the drive signal TRG is turned on, and the transfer gate 102 is turned on. This completes the exposure period, so that the electric charge accumulated in the photoelectric conversion element 101 during the exposure period is transferred to the FD unit 103 via the transfer gate 102.

At time t8, the drive signal TRG is turned off, and the transfer gate 102 is turned off. This stops transfer of the electric charge from the photoelectric conversion element 101 to the FD unit 103.

Then, at time tc, which is between time t8 and time t9, the drive signal SEL (not illustrated) is turned on, and the selecting transistor 109 is turned on. This causes a signal S1, which is based on the potential of the FD unit 103, to be output to the vertical signal line 23 via the amplifying transistor 108 and the selecting transistor 109. The signal S1 is a signal which is based on the electric charge accumulated in the photoelectric conversion element 101 during the exposure period. Accordingly, the signal S1 does not include a component derived from the electric charge overflowing from the photoelectric conversion element 101 and transferred to the capacitance element 107.

Thereafter, the drive signal SEL is turned off, and reading of the signal S1 is stopped.

At time t9, the drive signal RST2 is turned on, and the second reset gate 105 is turned on. This causes the potential coupling among the FD unit 103, the node 106, and the capacitance element 107, and the electric charge accumulated in the FD unit 103 and the capacitance element 107 is accumulated in the region where the potential coupling is achieved.

Then, at time td, which is between time t9 and time t10, the drive signal SEL (not illustrated) is turned on, and the selecting transistor 109 is turned on. This causes a signal S2, which is based on the potential of the region where the potential coupling is achieved among the FD unit 103, the node 106, and the capacitance element 107, to be output to the vertical signal line 23 via the amplifying transistor 108 and the selecting transistor 109. The signal S2 is a signal, which is based on the electric charge generated in the photoelectric conversion element 101 during the exposure period and including the electric charge overflowing from the photoelectric conversion element 101 and transferred to the capacitance element 107.

Thereafter, the drive signal SEL is turned off, and the reading of the signal S2 is stopped.

At time t10, the drive signals RST1 and OFG are turned on, and the first reset gate 104 and the overflow gate 110 are turned on. This causes the potential of the region where the potential coupling is achieved among the FD unit 103, the node 106, and the capacitance element 107 to be reset to the level of the supply voltage VDD. Furthermore, the electric charge accumulated in the photoelectric conversion element 101 is discharged via the overflow gate 110, and the photoelectric conversion element 101 is reset.

At time t11, the drive signal RST1 is turned off, and the first reset gate 104 is turned off.

At time t12, the drive signal OFG is turned off, and the overflow gate 110 is turned off.

Thereafter, the operation from time t1 to time t12 is executed repeatedly.

For example, the column signal processing circuit 13 (FIG. 1) of the imaging device 10 takes difference between the signal S1 and the signal N1 to generate a signal SN1. The signal SN1 is a signal obtained by removing, from the signal S1, a fixed pattern noise unique to the pixel, such as a reset noise or a variation on the threshold value of the amplifying transistor within the pixel.

Furthermore, for example, the column signal processing circuit 13 takes difference between the signal S2 and the signal N2 to generate a signal SN2. The signal SN2 is a signal obtained by removing, from the signal S2, the fixed pattern noise unique to the pixel, such as a reset noise or a variation on the threshold value of the amplifying transistor within the pixel.

Then, for example, the signal processing circuit, which is disposed in the subsequent stage of the output circuit 15, selects the signal SN1 or the signal SN2 corresponding to the light amount of incident light for each pixel, or synthesizes the signal SN1 and the signal SN2 at a ratio in accordance with the light amount of incident light for each pixel, thus enlarging a dynamic range of the imaging device 10. For example, the signal processing circuit generates the pixel signal on the basis of the signal SN1 in a case where the light amount of incident light is smaller than a predetermined threshold value, and generates the pixel signal on the basis of the signal SN2 in a case where the light amount of incident light is equal to or larger than the predetermined threshold value. Alternatively, for example, the signal processing circuit synthesizes the signal SN1 and the signal SN2 to generate the pixel signal in such a manner as to increase the ratio of the signal SN1 as the light amount of incidence light is smaller and increase the ratio of the signal SN2 as the light amount of incidence light is larger.

This achieves enlargement of the dynamic range by increasing the saturation level of the pixel signal, while favorably maintaining sensitivity or the S/N ratio.

2. First Embodiment

Next, a first embodiment of the present technology is described by referring to FIGS. 4 to 19.

Exemplary Structure of Pixel 21a

Figure 4:
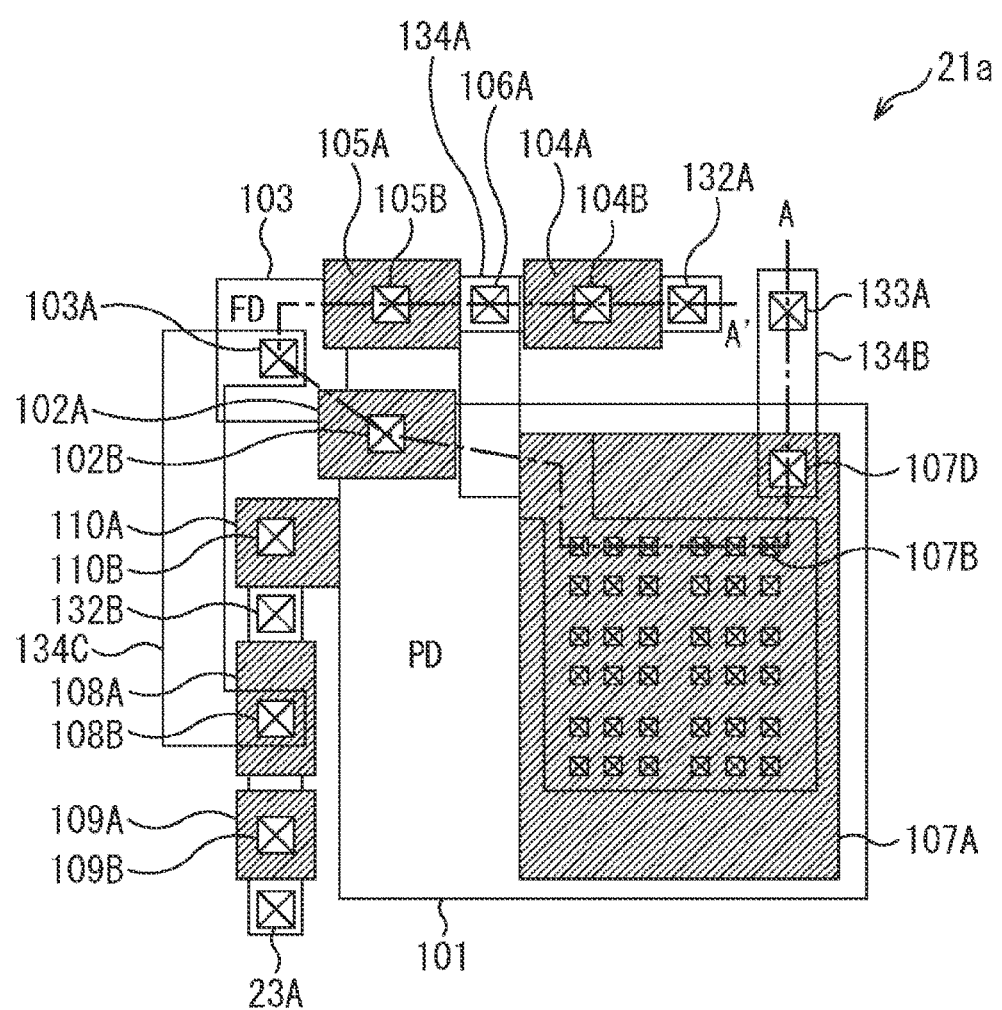
FIG. 4 is a plan view schematically illustrating a first embodiment of the pixel.
Figure 5:
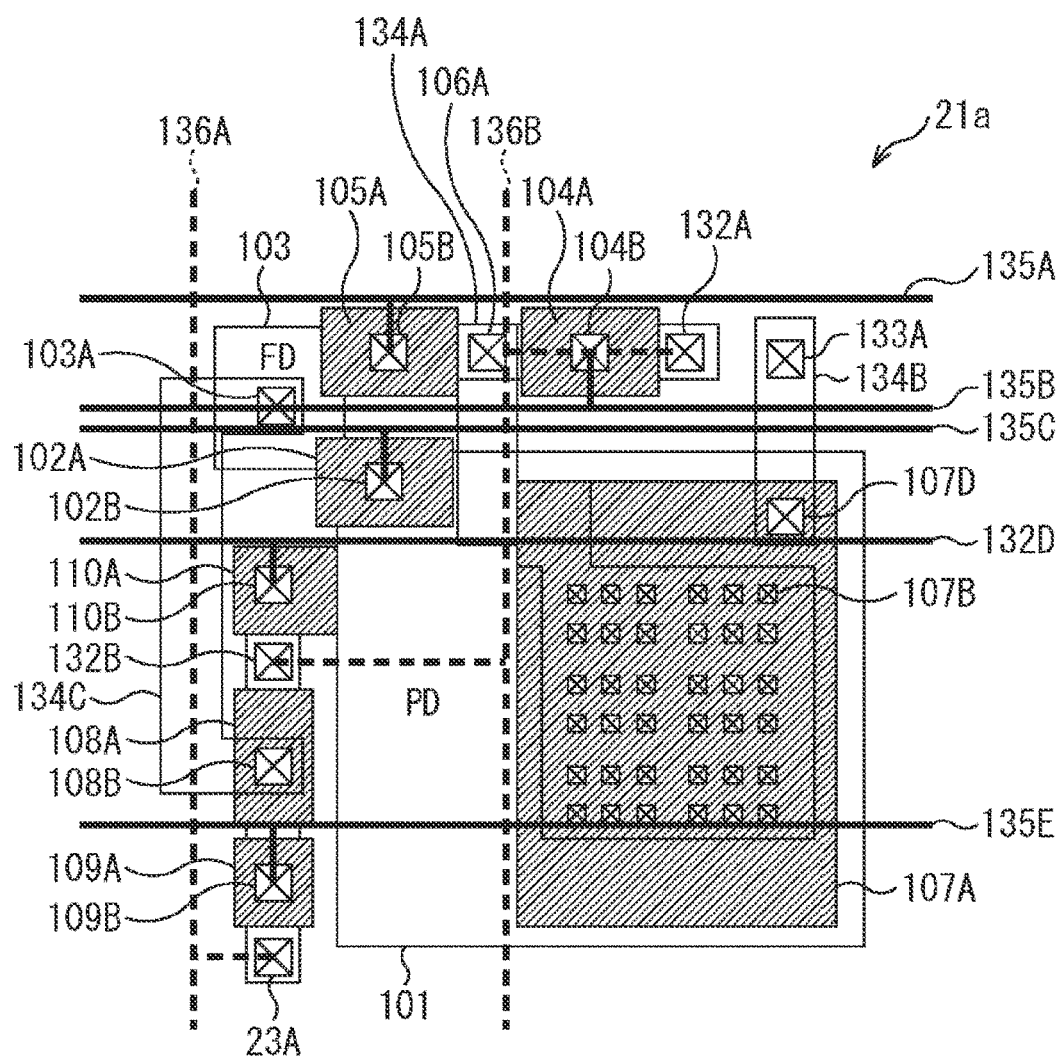
FIG. 5 is a plan view schematically illustrating the first embodiment of the pixel.
Figure 6:
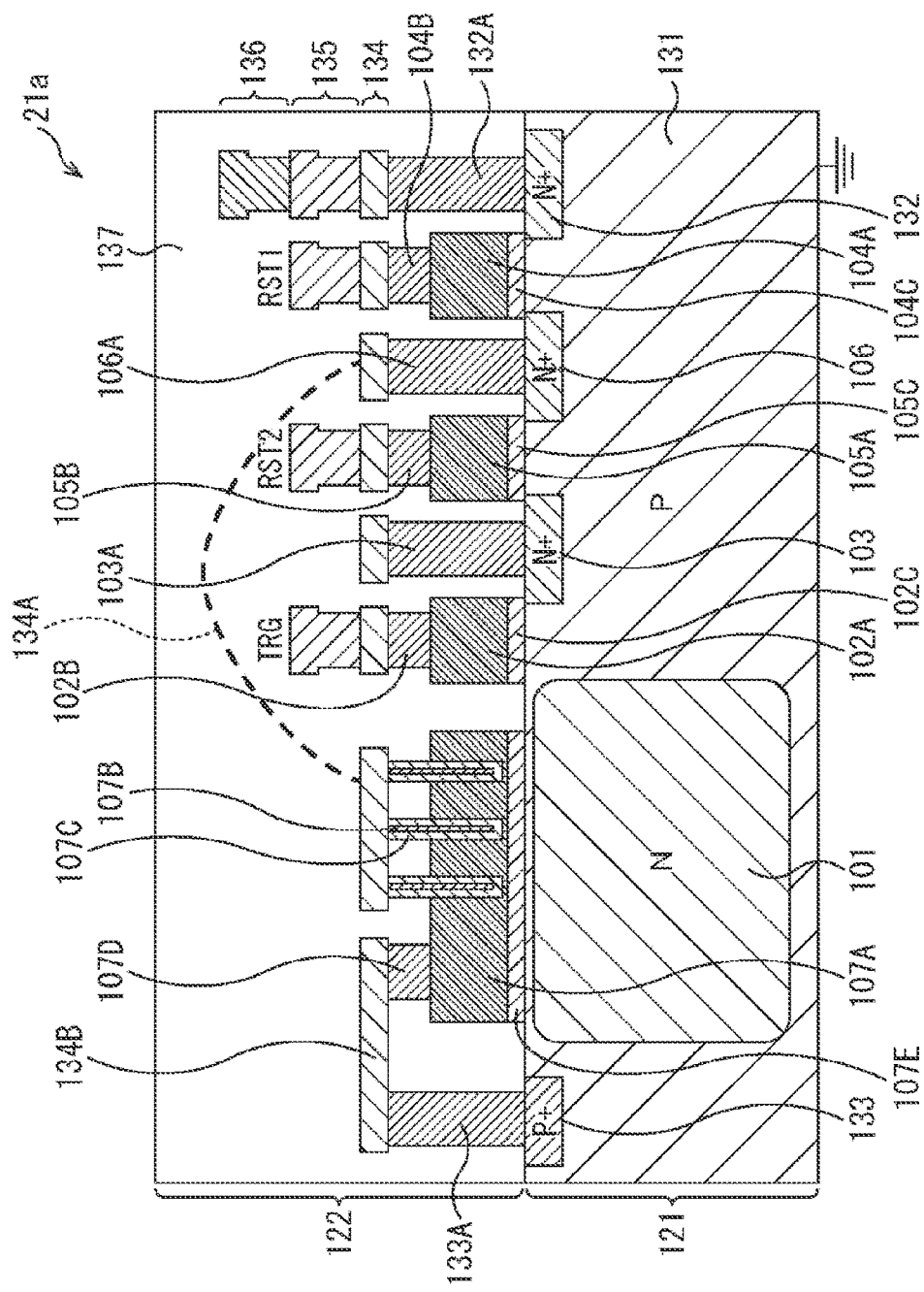
FIG. 6 is a cross-sectional view schematically illustrating the first embodiment of the pixel.

FIGS. 4 to 6 illustrate an exemplary structure of a pixel 21a as a first embodiment of the pixel 21 of the imaging device 10. FIGS. 4 and 5 are plan views schematically illustrating the exemplary structure of the pixel 21a, in which the second and third wiring layers 135 and 136 are eliminated from FIG. 4, and the second and third wiring layers 135 and 136 are added to FIG. 5. FIG. 6 schematically illustrates a cross-section of the pixel 21a along A-A' of FIG. 4.

Note that, hereinafter, a lengthwise direction of FIG. 6 is regarded as a vertical direction of the pixel 21a, the side where a semiconductor substrate 121 is illustrated is regarded as the lower side of the pixel 21a, and the side where a wiring layer 122 is illustrated is regarded as the upper side of the pixel 21a. Furthermore, hereinafter, in the horizontal direction (planar direction) of the pixel 21a, the lengthwise direction of FIGS. 4 and 5 is regarded as the lengthwise direction of the pixel 21a and the widthwise direction of FIGS. 4 and 5 is regarded as the widthwise direction of the pixel 21a.

First, by referring to FIGS. 4 and 5, the disposition of the pixel 21a in the horizontal direction is mainly described.

As illustrated in FIGS. 4 and 5, the most part of the pixel 21a is occupied by the photoelectric conversion element 101. Furthermore, a lower electrode 107A is disposed so as to vertically overlap the photoelectric conversion element 101. In other words, the rectangular lower electrode 107A is disposed so as to cover the most part of the right-hand side of the upper surface (the surface opposite to the incidence surface) of the photoelectric conversion element 101. A plurality of upper electrodes 107B is arranged two-dimensionally on the lower electrode 107A. Note that the rectangular cross-section is illustrated for the lower electrode 107A in the drawing, but the actual cross-section is substantially circular.

Furthermore, a contact 107D is connected to the upper surface of the lower electrode 107A in the upper right corner of the drawing. A gate electrode 102A of the transfer gate 102 is disposed in the upper part of the photoelectric conversion element 101 in the upper left corner of the drawing. A contact 102B is connected to the upper surface of the gate electrode 102A.

The FD unit 103 is disposed in the obliquely upper left direction of the photoelectric conversion element 101 in the drawing. A contact 103A is connected to the upper surface of the FD unit 103.

On the right side of the FD unit 103 in the drawing, a gate electrode 105A of the second reset gate 105, a contact 106A, a gate electrode 104A of the first reset gate 104, a contact 132A, and a contact 133A are arranged laterally. A contact 105B is connected to the upper surface of the gate electrode 105A. A contact 104B is connected to the upper surface of the gate electrode 104A.

On the lower side of the FD unit 103 in the drawing, a gate electrode 110A of the overflow gate 110, a contact 132B, a gate electrode 108A of the amplifying transistor 108, a gate electrode 109A of the selecting transistor 109, and a contact 23A are arranged longitudinally. A contact 110B is connected to the upper surface of the gate electrode 110A. A contact 108B is connected to the upper surface of the gate electrode 108A. A contact 109B is connected to the upper surface of the gate electrode 109A.

Note that the rectangular cross-section is illustrated for each contact in the drawing, but the actual cross-section is substantially circular.

Furthermore, a wire 134A of the first wiring layer 134 (FIG. 6) connects each upper electrode 107B and the contact 106A. A wire 134B of the first wiring layer 134 connects the contact 107D and the contact 133A.

A wire 134C of the first wiring layer 134 connects the contact 103A and the contact 108B. Accordingly, the FD unit 103 and the gate electrode 108A of the amplifying transistor 108 are electrically connected via the contact 103A, the wire 134C, and the contact 108B.

A wire 135A of the second wiring layer 135 (FIG. 6) is connected to the contact 105B. Then, the gate electrode 105A of the second reset gate 105 is electrically connected to the vertical drive circuit 12 via the contact 105B and the wire 135A.

A wire 135B of the second wiring layer 135 is connected to the contact 104B. Then, the gate electrode 104A of the first reset gate 104 is electrically connected to the vertical drive circuit 12 via the contact 104B and the wire 135B.

A wire 135C of the second wiring layer 135 is connected to the contact 102B. Then, the gate electrode 102A of the transfer gate 102 is electrically connected to the vertical drive circuit 12 via the contact 102B and the wire 135C.

A wire 135D of the second wiring layer 135 is connected to the contact 110B. Then, the gate electrode 110A of the overflow gate 110 is electrically connected to the vertical drive circuit 12 via the contact 110B and the wire 135D.

A wire 135E of the second wiring layer 135 is connected to the contact 109B. Then, the gate electrode 109A of the selecting transistor 109 is electrically connected to the vertical drive circuit 12 via the contact 109B and the wire 135E.

A wire 136A of the third wiring layer 136 (FIG. 6) forms the vertical signal line 23 which is connected to the contact 23A. Accordingly, the source electrode of the selecting transistor 109 is electrically connected to the vertical signal line 23 via the contact 23A.

A wire 136B of the third wiring layer 136 is connected to the contact 132A and the contact 132B. Then, the drain electrode of the first reset gate 104 is electrically connected to the power supply VDD via the contact 132A and the wire 136B. Furthermore, the drain electrode of the amplifying transistor 108 and the drain electrode of the overflow gate 110 are electrically connected to the power supply VDD via the contact 132B and the wire 136B.

Next, the disposition of the pixel 21a of FIG. 4 in the vertical direction along A-A' is mainly described by referring to FIG. 6.

The pixel 21a receives light incident on the bottom surface (incidence surface) of the semiconductor substrate 121. Furthermore, the wiring layer 122 is stacked on the upper surface side, which is opposite to the bottom surface (the incidence surface of the photoelectric conversion element 101), of the semiconductor substrate 121. Accordingly, the imaging device 10 including the pixel 21a forms a backside irradiation-type CMOS image sensor.

An N-type buried layer is buried in a P-type well layer 131 of the semiconductor substrate 121, and the buried-type photoelectric conversion element 101 is formed by the N-type buried layer.

Furthermore, the FD unit 103 including an N+-type layer, the node 106 including the N+-type layer, a power supply 132 including the N+-type layer, and a power supply 133 including a P+-type layer are formed near the surface of the P-type well layer 131.

In the wiring layer 122, gate electrodes, electrodes, contacts, and the first to third wiring layers 134 to 136 are formed in an interlayer insulating film 137.

Specifically, the lower electrode 107A is disposed on the photoelectric conversion element 101 via an insulating film 107E. A plurality of trenches each having a substantially oval cross-section is formed in the upper surface of the lower electrode 107A, and the upper electrode 107B is buried in each trench via an insulating film 107C. In the trench, a plurality of metal-insulator-metal (MIM)-type or metal-oxide-metal (MOM)-type trench type capacitors is formed in a region where the lower electrode 107A faces the upper electrode 107B via the insulating film 107C. Then, the plurality of trench type capacitors forms the capacitance element 107 of the pixel 21a.

The gate electrode 102A of the transfer gate 102 is disposed on the P-type well layer 131 via an insulating film 102C between the photoelectric conversion element 101 and the FD unit 103. A contact 102B is connected to the upper surface of the gate electrode 102A.

The gate electrode 105A of the second reset gate 105 is disposed on the P-type well layer 131 via an insulating film 105C between the FD unit 103 and the node 106. A contact 105B is connected to the upper surface of the gate electrode 105A.

The gate electrode 104A of the first reset gate 104 is disposed on the P-type well layer 131 via an insulating film 104C between the node 106 and the power supply 132. A contact 104B is connected to the upper surface of the gate electrode 104A.

The contact 103A, the contact 132A, and the contact 133A are connected respectively to the upper surfaces of the FD unit 103, the power supply 132, and the power supply 133.

Furthermore, the first wiring layer 134, the second wiring layer 135, and the third wiring layer are stacked in this order from the bottom on the upper surface of each contact and the upper electrode 107B.

Then, the upper electrode 107B and the node 106 are electrically connected via the wire 134A and the contact 106A. The power supply 132 is electrically connected to the power supply VDD (not illustrated) serving as a positive power supply of the pixel 21a via the contact 132A and the first to third wiring layers 134 to 136. Accordingly, the upper electrode 107B is connected to the power supply VDD side via the node 106 and the first reset gate 104.

Furthermore, the lower electrode 107A is electrically connected to the power supply 133 via the contact 107D, the wire 134B, and the contact 133A. The power supply 133 is connected to the ground via the P-type well layer 131 to form the power supply VSS serving as a negative power supply of the pixel 21a. Accordingly, the lower electrode 107A is connected to the power supply VSS side.

The gate electrodes 102A, 104A, 105A, 108A, 109A, and 110A and the lower electrode 107A include a conductive material such as polysilicon.

The contacts 23A, 102B, 103A, 104B, 105B, 106A, 107D, 108B, 109B, 110B, 132A, 132B, and 133A include a metal such as tungsten.

The insulating film 107C includes an insulating film having a high permittivity, such as a high-k material. Examples of the high-k material applicable to the insulating film 107C include silicon nitride (SiN), hafnium oxide (HfO2), aluminum oxide (Al2O3), zirconium oxide (ZrO2), tantalum oxide (Ta2O5), titanium oxide (TiO2), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3), and the like.

The insulating films 102C, 104C, 105C, and 107E include, for example, a high permittivity insulating film such as a high-k material, or an oxide film.

Method of Manufacturing Imaging Device 10

Next, a method of manufacturing each pixel 21a particularly of the imaging device 10 is described by referring to FIGS. 7 to 18.

Figure 7:
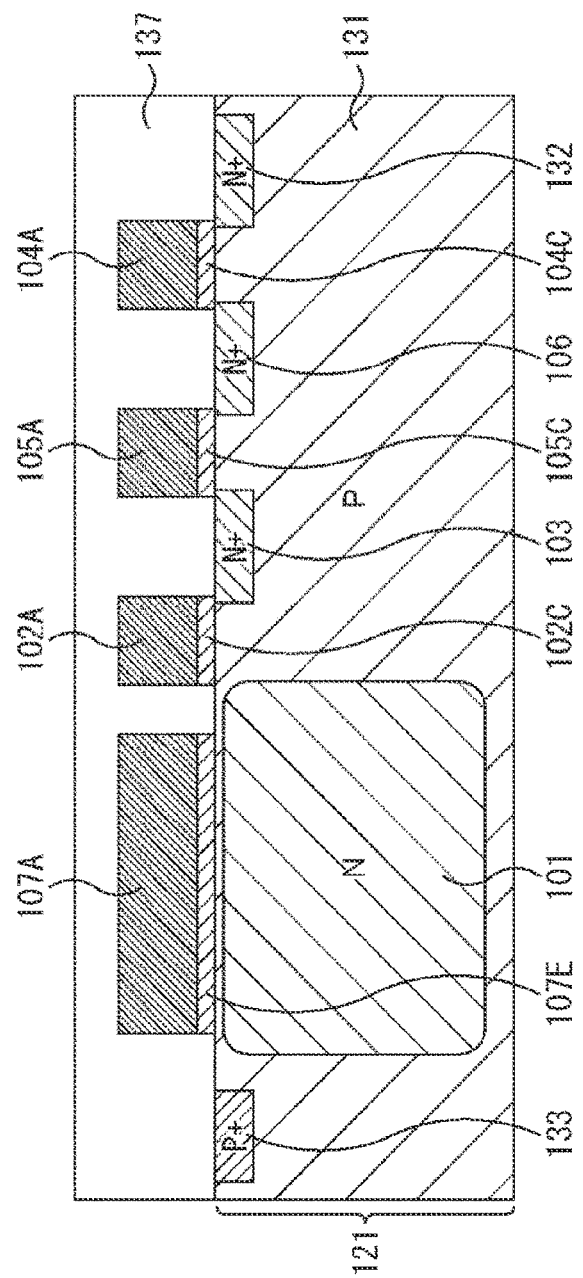
FIG. 7 is a view for explaining a method of manufacturing the pixel illustrated in FIGS. 4 to 6.

First, elements, gate electrodes, and the like of the pixel 21a are formed, as illustrated in FIG. 7. Specifically, the photoelectric conversion element 101 including the N-type layer, the FD unit 103 including the N+-type layer, the node 106, the power supply 132, and the power supply 133 including the P+-type layer are formed in the P-type well layer 131 of the semiconductor substrate 121. Furthermore, in the interlayer insulating film 137 stacked on the semiconductor substrate 121, the insulating film 107E and the lower electrode 107A are formed above the photoelectric conversion element 101, the insulating film 102C and the gate electrode 102A are formed between the photoelectric conversion element 101 and the FD unit 103, the insulating film 105C and the gate electrode 105A are formed between the FD unit 103 and the node 106, and the insulating film 104C and the gate electrode 104A are formed between the node 106 and the power supply 132.

Figure 8:
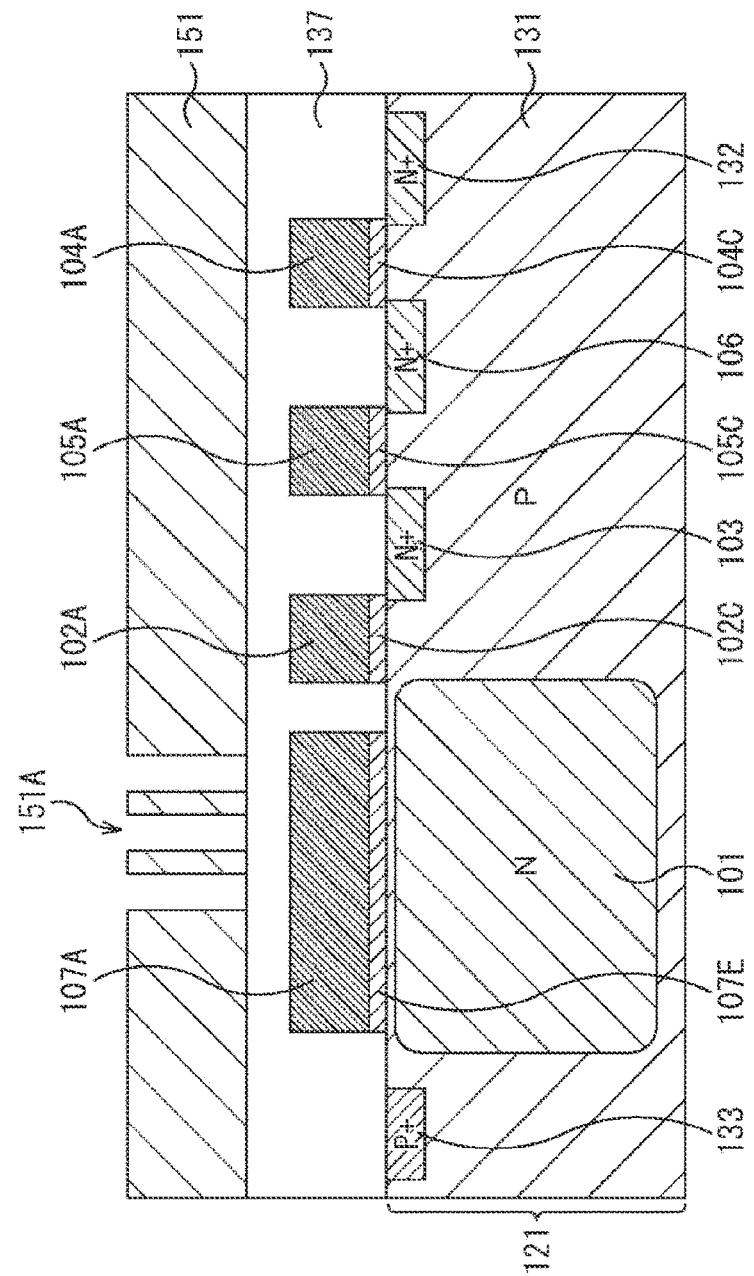
FIG. 8 is a view for explaining the method of manufacturing the pixel illustrated in FIGS. 4 to 6.

Next, as illustrated in FIG. 8, the surface of the interlayer insulating film 137 is masked by a photoresist 151. Furthermore, in the photoresist 151, a plurality of openings 151A each having a substantially oval opening is formed at positions corresponding to the positions where the upper electrodes 107B are formed.

Figure 9:
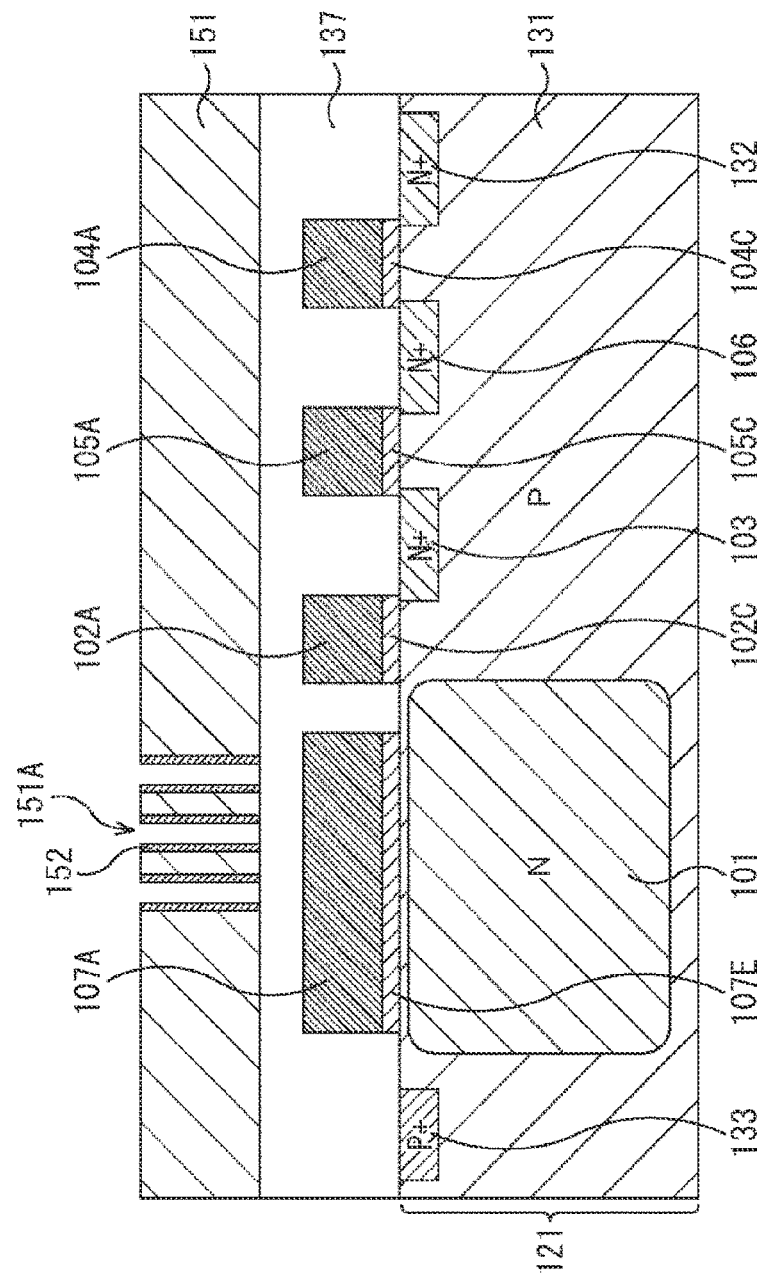
FIG. 9 is a view for explaining the method of manufacturing the pixel illustrated in FIGS. 4 to 6.

Next, as illustrated in FIG. 9, the openings 151A of the photoresist 151 are reduced. This step is carried out, for example, by directed self-assembly (DSA) lithography. For example, diblock copolymer is applied to each opening 151A of the photoresist 151, followed by thermal treatment. This allows a polymer 152 having high affinity with the material of the photoresist 151 to be concentrated on the wall surface of each opening 151A, while a low-affinity polymer (not illustrated) is concentrated on the center of each opening 151A. Thereafter, the polymers on the center are removed by, for example, etching such that the area of the opening 151A (diameter of the opening 151A) can be made smaller than the area (diameter) achievable by the normal lithography.

Here, the area (diameter) of each opening 151A can be made smaller than the opening area (diameter) of the trenches 137B to 137I (FIG. 13) used for forming the contacts connected to the gate electrode of each transistor in the pixel 21a.

Figure 10:
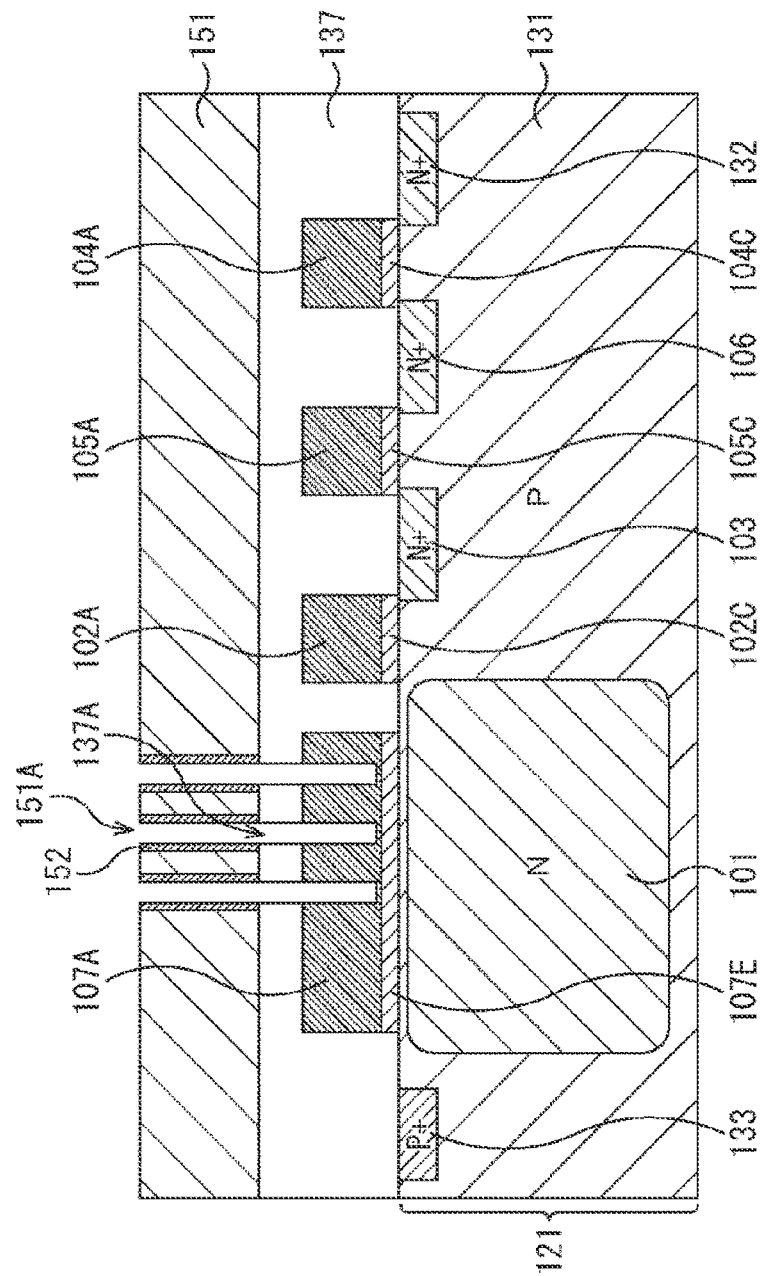
FIG. 10 is a view for explaining the method of manufacturing the pixel illustrated in FIGS. 4 to 6.

Next, as illustrated in FIG. 10, the interlayer insulating film 137 and the lower electrode 107A under the opening 151A of the photoresist 151 are dug, for example, by dry etching to form a plurality of trenches 137A in the interlayer insulating film 137 and the lower electrode 107A. The trenches 137A do not reach the bottom end of the lower electrode 107A and are terminated on the way to the lower electrode 107A. Furthermore, the opening area (diameter) of each trench 137A can be approximately equal to the area (diameter) of the opening 151A formed after the photoresist 151 is reduced, thus achieving a smaller area (diameter) compared to the case of using the normal lithography.

Here, as described above, the area (diameter) of each opening 151A is smaller than the opening (diameter) of each of the trenches 137B to 137I used for forming the contacts connected to the gate electrodes of the individual transistors in the pixel 21a. Accordingly, the opening (diameter) of each trench 137A is also smaller than the opening (diameter) of each of the trenches 137B to 137I.

Figure 11:
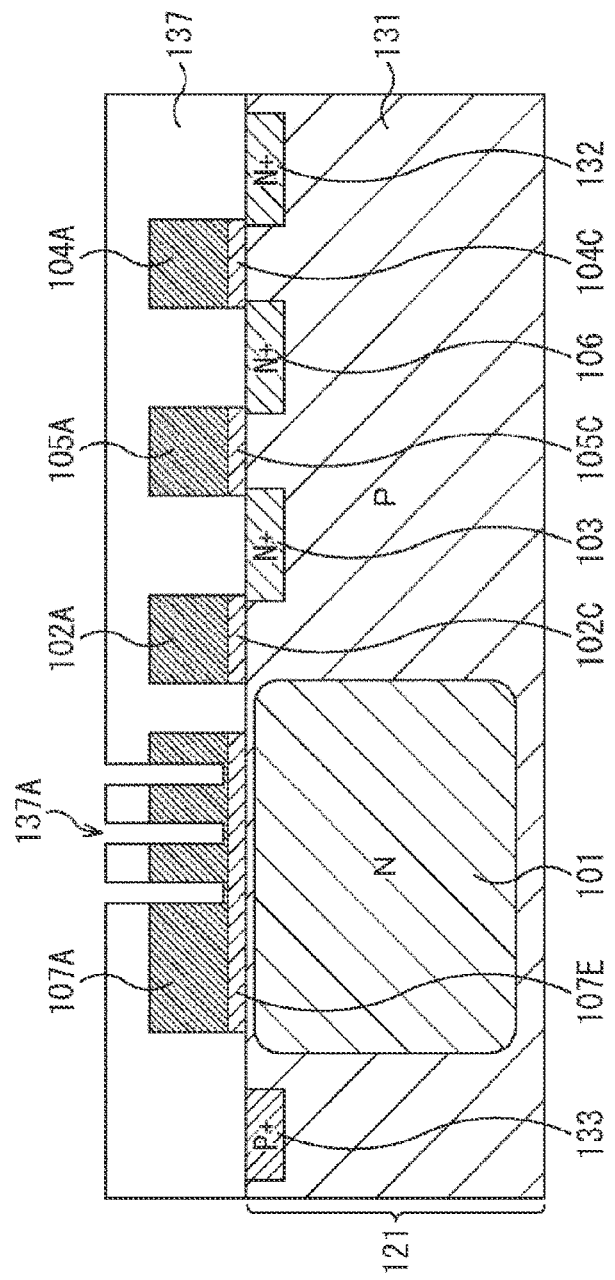
FIG. 11 is a view for explaining the method of manufacturing the pixel illustrated in FIGS. 4 to 6.

Next, as illustrated in FIG. 11, the photoresist 151 is removed.

Figure 12:
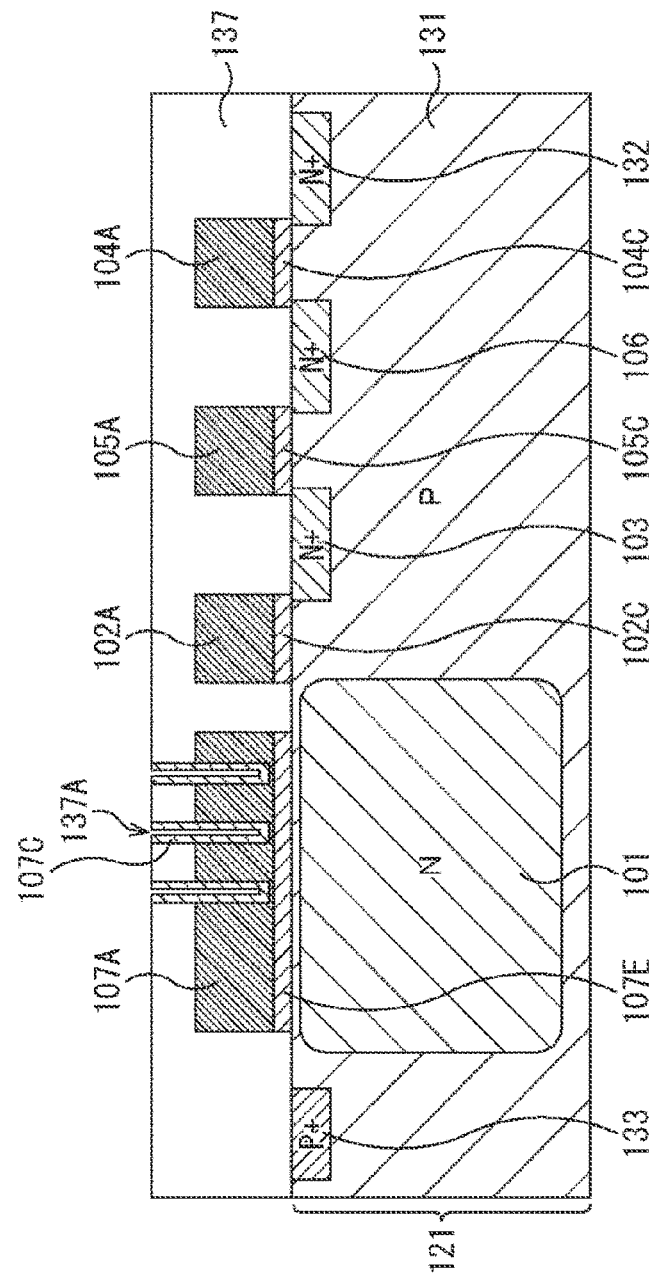
FIG. 12 is a view for explaining the method of manufacturing the pixel illustrated in FIGS. 4 to 6.

Next, as illustrated in FIG. 12, the insulating film 107C is formed on the inner surface (side wall and bottom surface) of each trench 137A.

Figure 13:
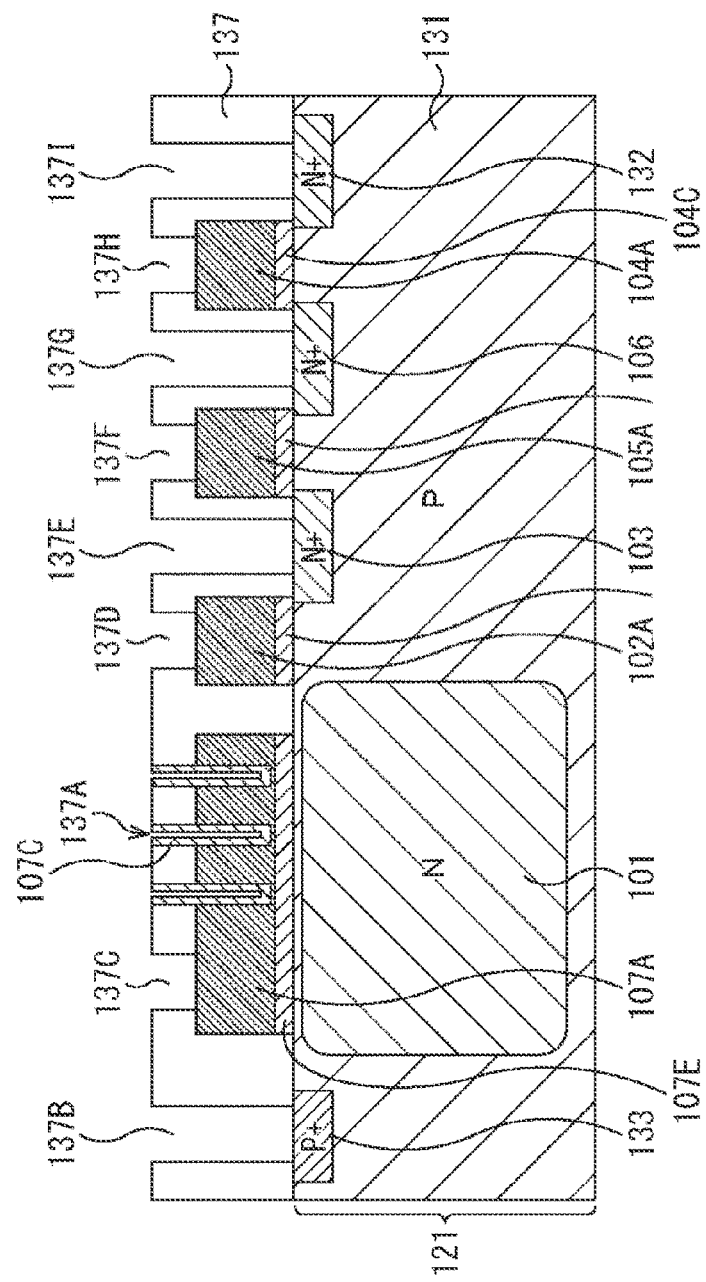
FIG. 13 is a view for explaining the method of manufacturing the pixel illustrated in FIGS. 4 to 6.

Next, as illustrated in FIG. 13, the trenches 137B to 137I used for contacts are formed in the interlayer insulating film 137.

Figure 14:
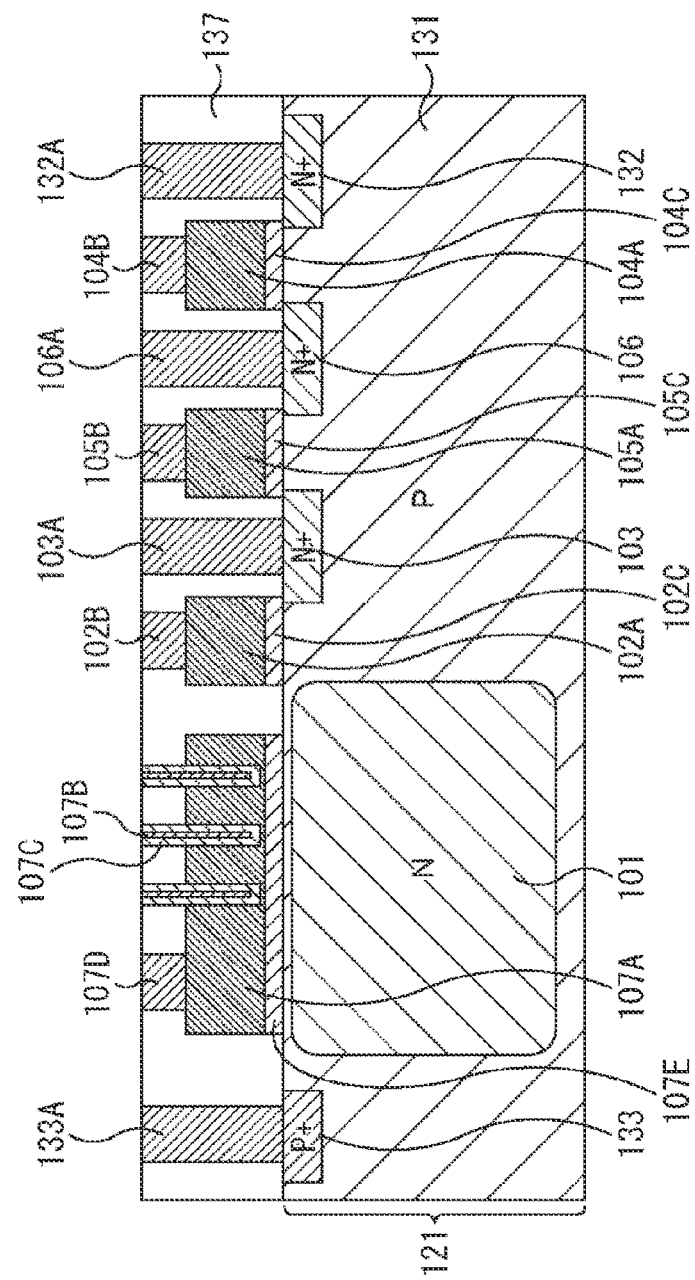
FIG. 14 is a view for explaining the method of manufacturing the pixel illustrated in FIGS. 4 to 6.

Next, as illustrated in FIG. 14, a metal such as tungsten may be buried in the trenches 137A to 137I. Thus, the upper electrodes 107B and the contacts 133A, 107D, 102B, 103A, 105B, 106A, 104B, and 132A are formed.

Here, as described above, the opening area (diameter) of the trench 137A used for forming the upper electrode 107B is smaller than the opening area (diameter) of each of the trenches 137B to 137I used for forming the contacts. Accordingly, the cross-sectional area (diameter) of the upper electrodes 107B is smaller than the cross-sectional area (diameter) of the contacts 133A, 107D, 102B, 103A, 105B, 106A, 104B, and 132A.

Figure 15:
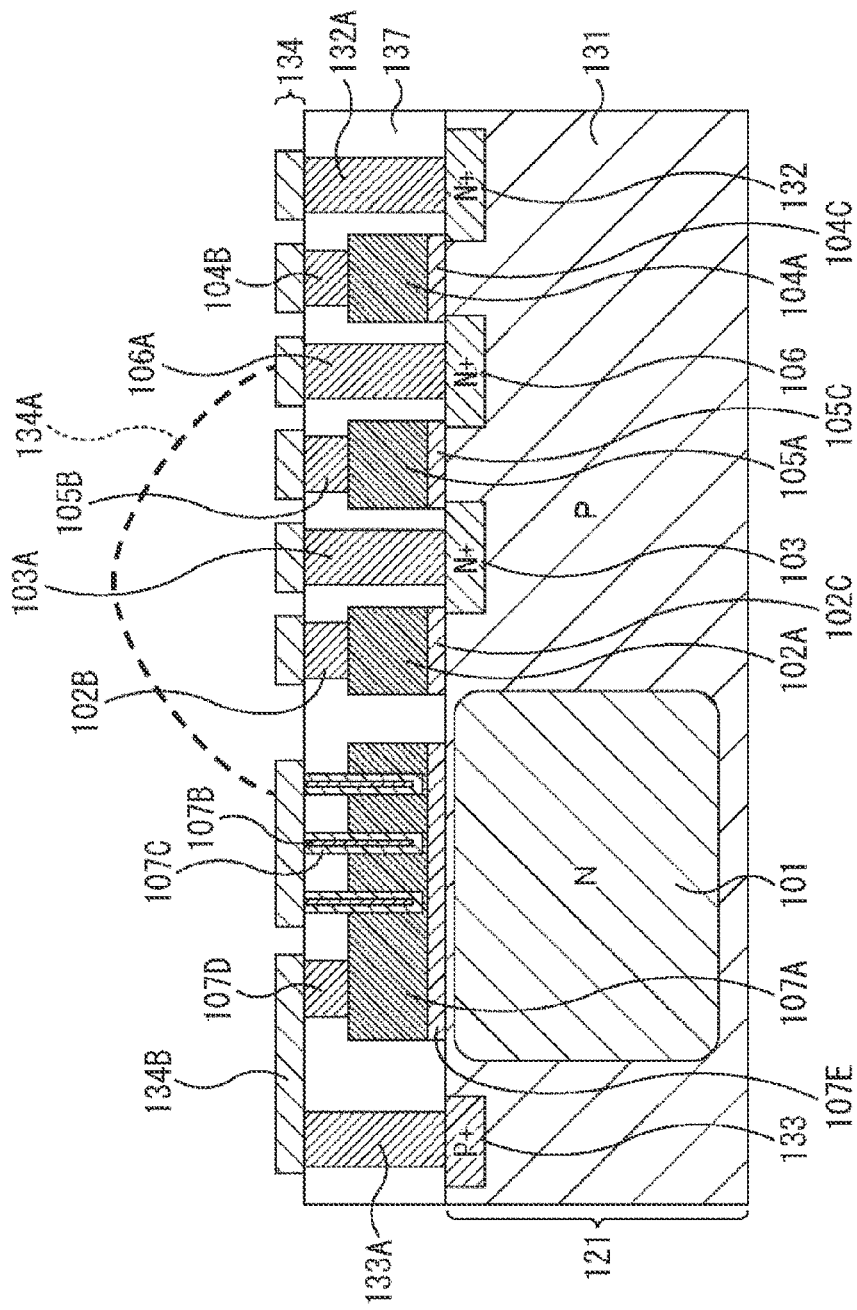
FIG. 15 is a view for explaining the method of manufacturing the pixel illustrated in FIGS. 4 to 6.

Next, as illustrated in FIG. 15, the first wiring layer 134 is formed on the interlayer insulating film 137.

Figure 16:
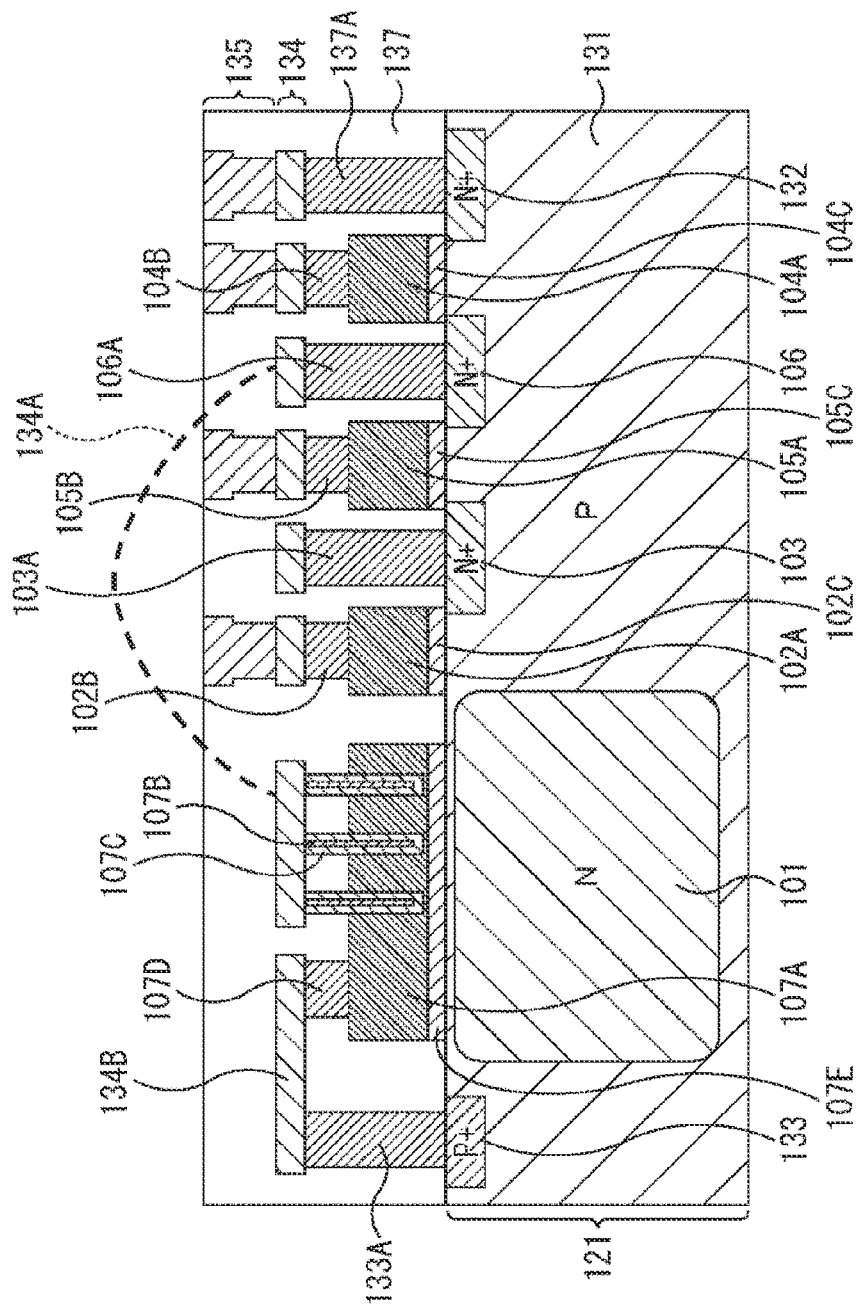
FIG. 16 is a view for explaining the method of manufacturing the pixel illustrated in FIGS. 4 to 6.

Next, as illustrated in FIG. 16, the interlayer insulating film 137 is stacked upward, while the second wiring layer 135 is formed on the first wiring layer 134.

Figure 17:
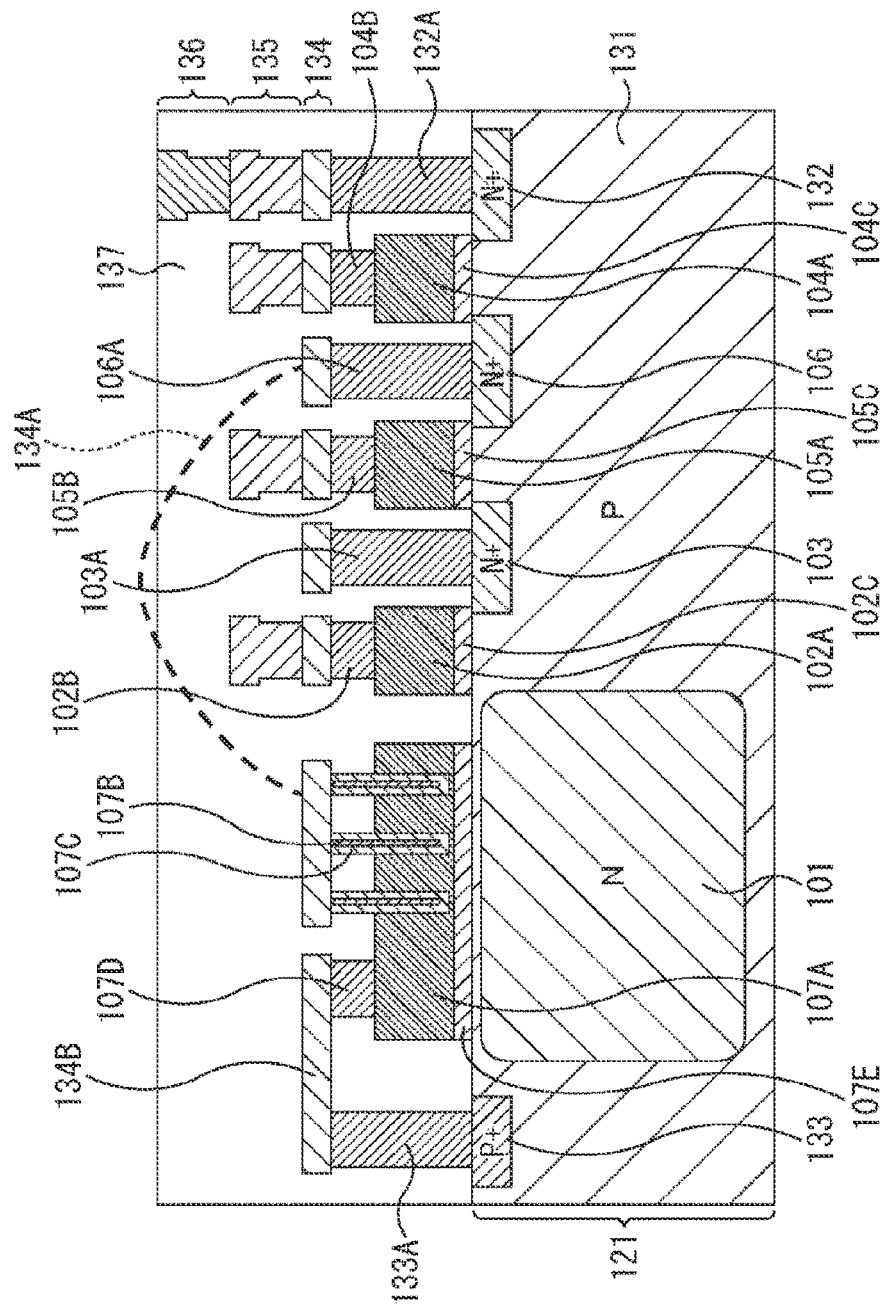
FIG. 17 is a view for explaining the method of manufacturing the pixel as illustrated in FIGS. 4 to 6.

Next, as illustrated in FIG. 17, the interlayer insulating film 137 is further stacked upward, while the third wiring layer 136 is formed on the second wiring layer 135.

Figure 18:
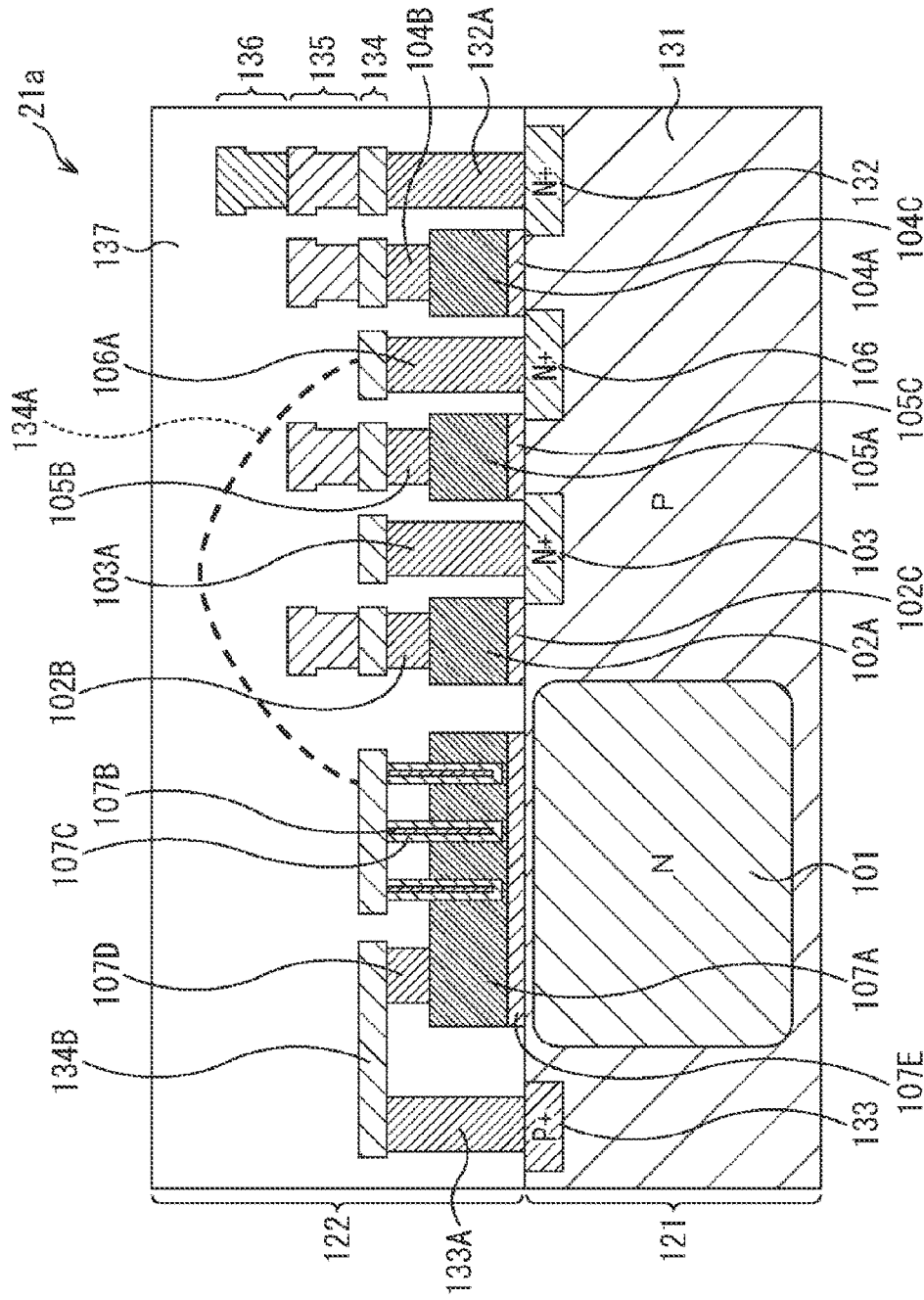
FIG. 18 is a view for explaining the method of manufacturing the pixel illustrated in FIGS. 4 to 6.

Next, as illustrated in FIG. 18, the interlayer insulating film 137 is further stacked upward.

Thus, each pixel 21a of the imaging device 10 is manufactured.

Note that, in the pixel 21a, the capacitance element 107 is disposed above the surface opposite to the incidence surface of the photoelectric conversion element 101. Accordingly, it is not necessary to reduce the light receiving area of the photoelectric conversion element 101 for providing the capacitance element 107, thus preventing the decrease of sensitivity of the imaging device 10.

Furthermore, because the capacitance element 107 is formed by the plurality of trench type capacitors, the capacity of the capacitance element 107 can be increased compared to, for example, the case where a planar type capacitor including a planar electrode is used. For example, a diameter x of the upper electrode 107B and a depth d to which the upper electrode 107B is buried in the lower electrode 107A are designed in such a manner that an area sum (total area) of a portion in which the upper electrode 107B of each trench type capacitor faces the lower electrode 107A is larger than the area of a region where the upper electrodes 107B (trench type capacitors) are disposed in the lower electrode 107A. Thus, the capacitance element 107 can increase its capacity compared to the case where the planar type capacitor is used.

Figure 19:
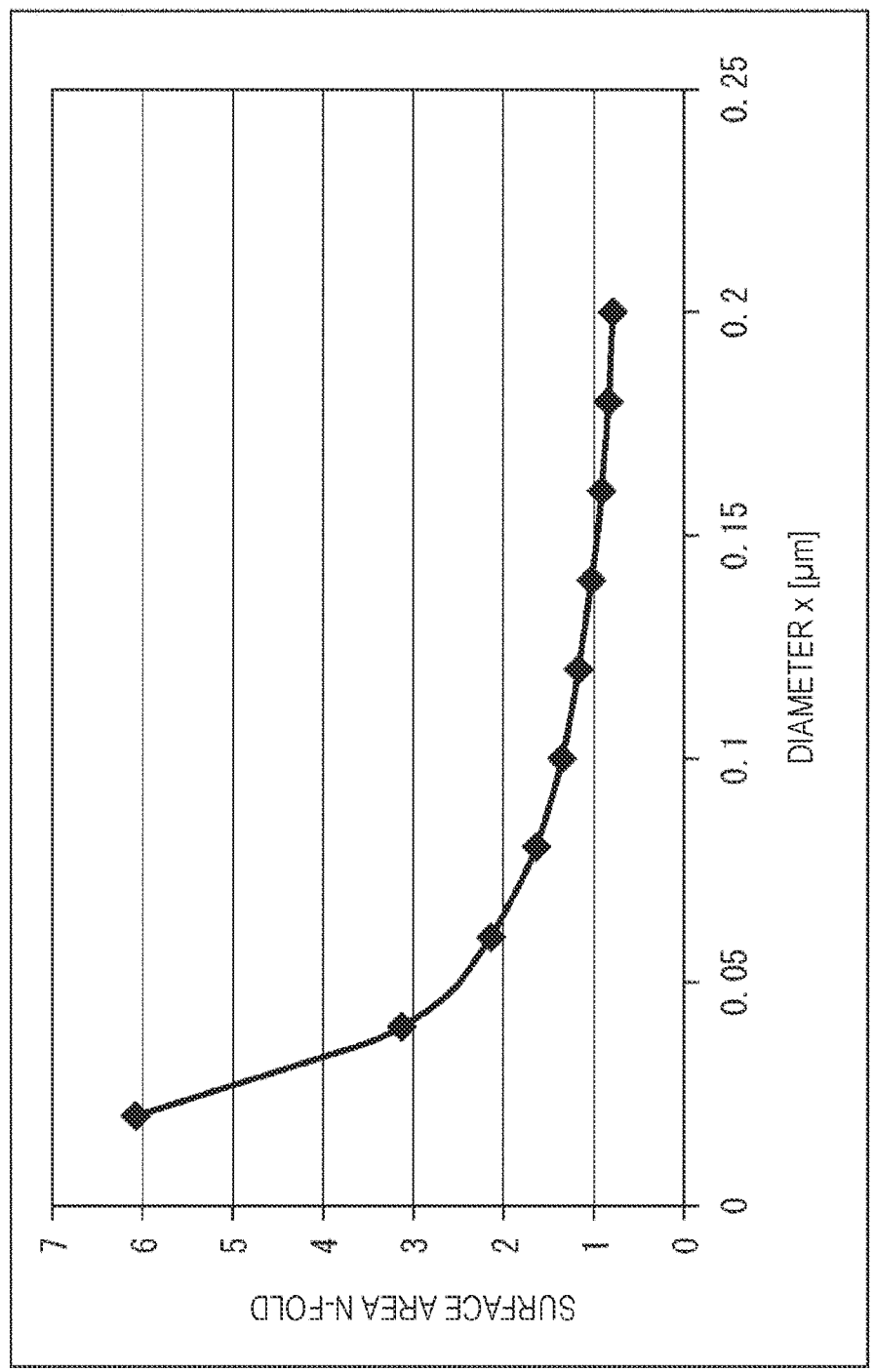
FIG. 19 is a graph plotting the surface area of an upper electrode of trench type capacitors, to which the present technology is applied, compared to the surface area of a planar type capacitor.

FIG. 19 is a graph plotting a comparison example of the surface area of the upper electrode of the capacitance element 107 between a case where the plurality of trench type capacitors is arranged in a square region with the side length of 1 μm and a case where the planar type capacitor having a square and planar upper electrode with the side length of 1 μm is used. A horizontal axis represents the diameter x of the upper electrode 107B of each trench type capacitor, and the vertical axis represents that how many folds the sum of the surface area (total area) of the upper electrodes 107B of the trench type capacitors is relative to the surface area of the upper electrode of the planar type capacitor.

Note that the total surface area of the upper electrodes 107B of the trench type capacitors is calculated on the basis of the following conditions:

The trench type capacitors are arranged two-dimensionally in the square region.

A distance between adjacent trench type capacitors is set equal to the diameter x of the upper electrode 107B. For example, in a case where the diameter x of the upper electrode 107B is 0.02 μm, the distance between the adjacent trench type capacitors is 0.02 μm. In this case, a distance between centers of the adjacent trench type capacitors is 0.04 μm, allowing 625 trench type capacitors to be arranged in the square region with the side length of 1 μm.

A depth d of the upper electrode 107B buried in the trench of the lower electrode 107A is set to 0.15 μm.

The surface area of one upper electrode 107B is regarded as the surface area of a portion facing the lower electrode 107A. Accordingly, the surface area of one upper electrode 107B is obtained by adding an area of a portion of the side surface of the upper electrode 107B buried in the trench of the lower electrode 107A and an area of the bottom surface of the upper electrode 107B.

Then, in a case where the diameter x of the upper electrode 107B is changed, the total area of the surface of the upper electrode 107B of the trench type capacitors increases as the diameter x of the upper electrode 107B decreases and the ratio of the diameter x relative to the depth d becomes small, as illustrated in FIG. 19. Meanwhile, the total area of the surface of the upper electrodes 107B of the trench type capacitors decreases, as the diameter x of the upper electrode 107B increases and the ratio of the diameter x relative to the depth d becomes large.

As a result, in a case where the diameter of the upper electrode 107B is not larger than 0.14 μm, the total area of the surface of the upper electrode 107B of the trench type capacitors is larger than the area (1 μm2) of the upper electrode of the planar type capacitor. Accordingly, the capacity of the capacitance element 107 including the trench type capacitors becomes larger than the capacity of the capacitance element 107 including the planar type capacitor.

Meanwhile, in a case where the diameter of the upper electrode 107B is equal to or larger than 0.15 μm, the total area of the surface of the upper electrodes 107B of the trench type capacitors is smaller than the area of the upper electrode of the planar type capacitor. Accordingly, the capacity of the capacitance element 107 including the trench type capacitors becomes smaller than the capacity of the capacitance element 107 including the planar type capacitor.

Note that, under the above conditions, assuming that when the relationship of diameter x<d/1.02324 is satisfied, the total area of the surface of the upper electrodes 107B of the trench type capacitors is larger than the area of the upper electrode of the planar type capacitor.

Thus, the capacitance of the capacitance element 107 can be increased by reducing the diameter (diameter of the upper electrode 107B) of the trench of the individual trench type capacitors, and increasing the number of the trench type capacitors per unit area.

Here, as described above, the diameter (diameter of the upper electrode 107B) of the trench of the individual trench type capacitors can be reduced and the number of the trench type capacitors per unit area can be increased by using the directed self assembly lithography. For example, the trenches 137A may be formed in the lower electrode 107A by the directed self assembly lithography according to the above-described method and, after the photoresist 151 is removed, the directed self assembly lithography is used again to form the trenches 137A in the region of the lower electrode 107A where the trenches 137A are not formed. Thus, the trenches 137A each having a small diameter can be formed densely in the lower electrode 107, and the number of the trench type capacitors per unit area can be increased. Note that the directed self assembly lithography can be carried out at least three times to form the trenches 137A in the lower electrode 107A.

Furthermore, the installation area of the capacitance element 107 can be reduced using, for example, the above-described trench type capacitors. As a result, the decrease of sensitivity of the imaging device 10 can further be prevented, and downsizing the imaging device 10 can also be achieved.

Note that, unlike the upper electrodes 107B, the contacts connected to the gate electrodes of the individual transistors in the pixel 21a preferably have the largest possible diameter so as to increase the area that comes into contact with the gate electrodes to decrease a resistance value.

3. Second Embodiment

Figure 20:
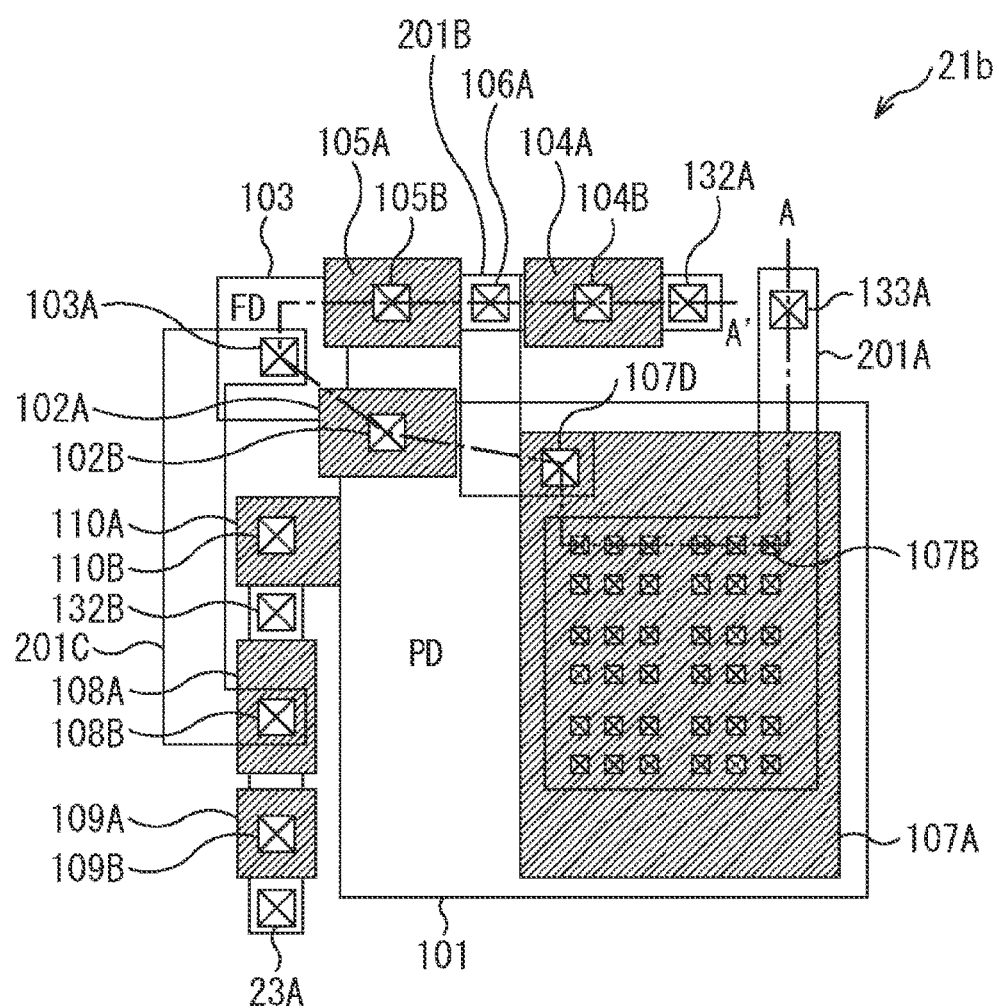
FIG. 20 is a plan view schematically illustrating a second embodiment of a pixel.
Figure 21:
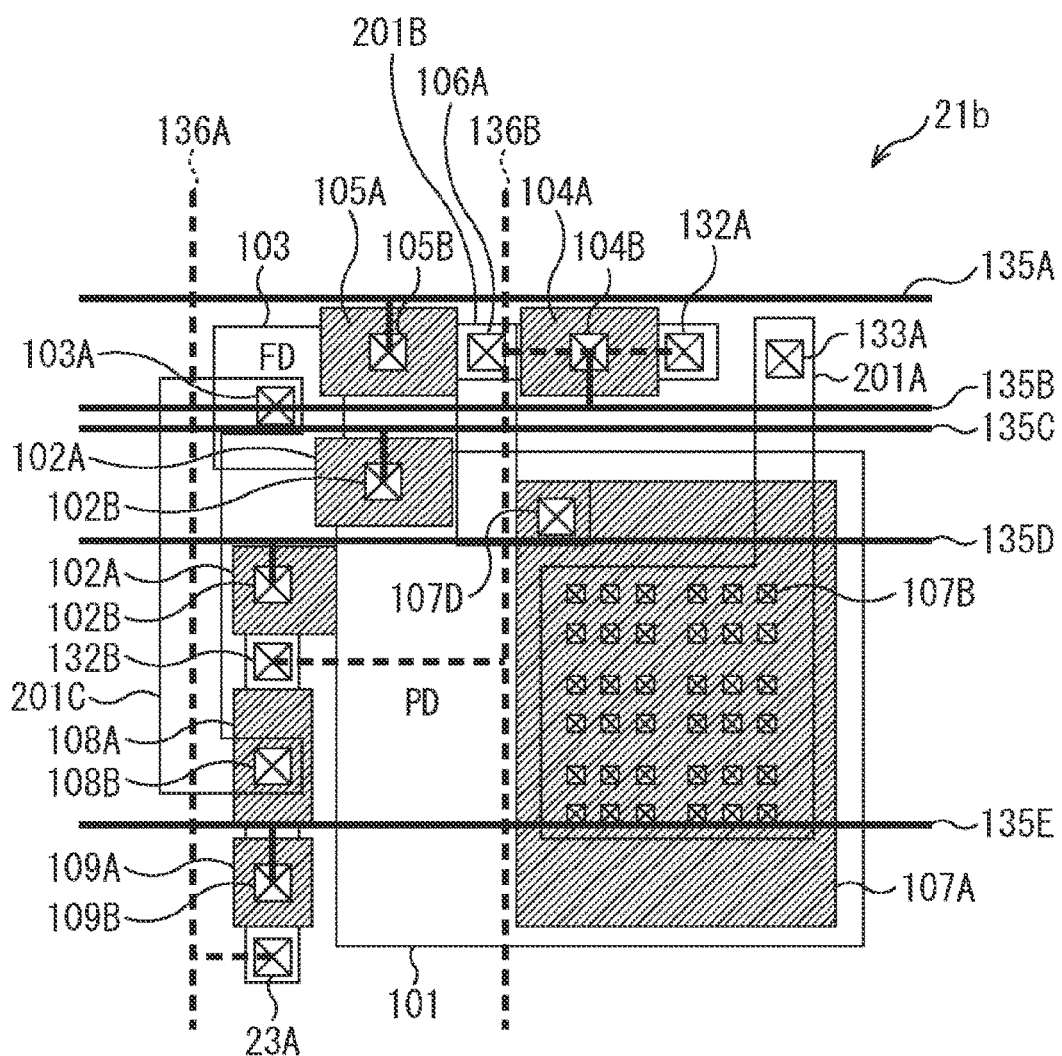
FIG. 21 is a plan view schematically illustrating the second embodiment of the pixel.
Figure 22:
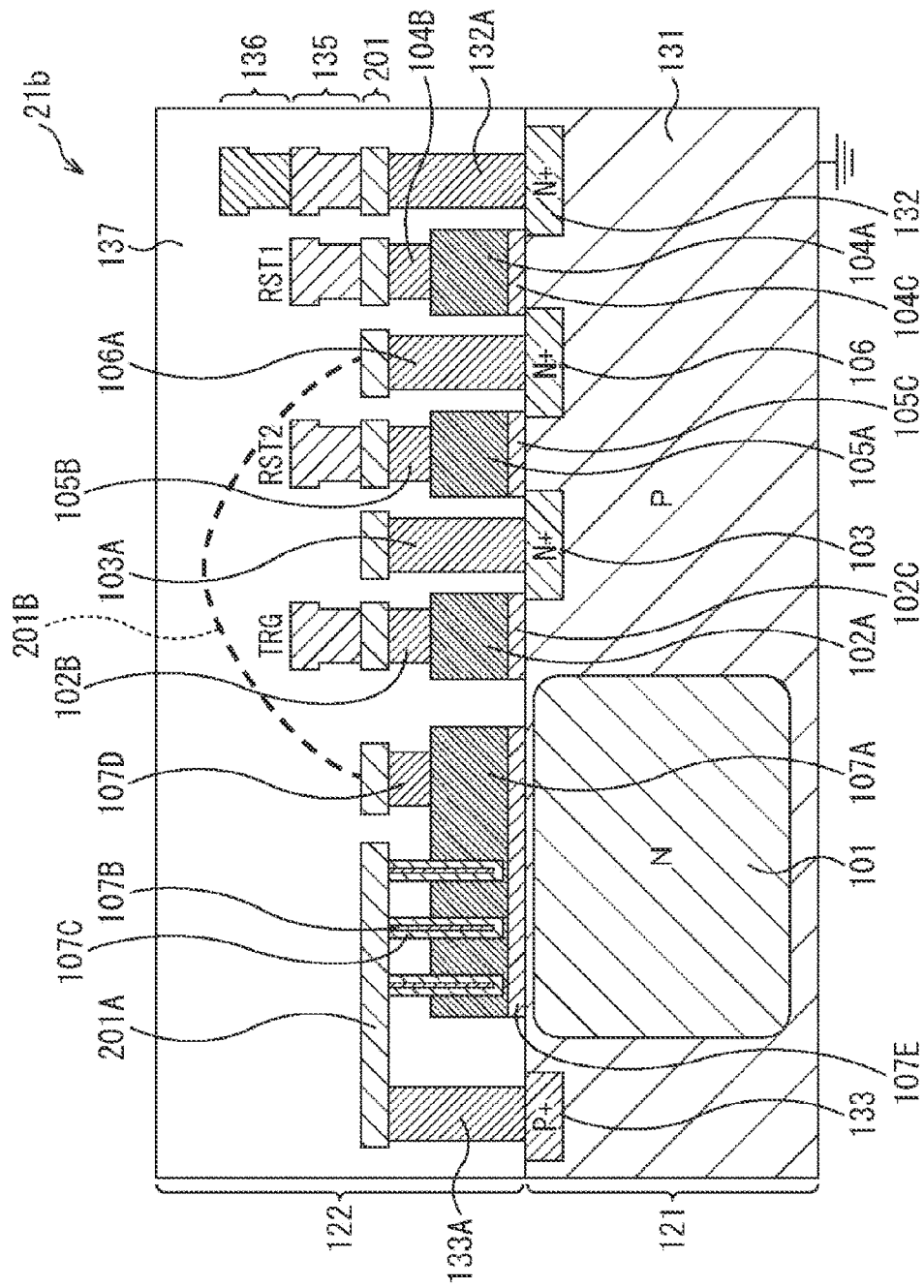
FIG. 22 is a cross-sectional view schematically illustrating the second embodiment of the pixel.

Next, a second embodiment of the present technology is described by referring to FIGS. 20 to 22.

FIGS. 20 to 22 illustrate an exemplary structure of a pixel 21b as a second embodiment of the pixel 21 of the imaging device 10. FIGS. 20 and 21 are plan views schematically illustrating the exemplary structure of the pixel 21b, in which the second wiring layer 135 and the third wiring layer 136 are eliminated from FIG. 20, and the second wiring layer 135 and the third wiring layer 136 are added in FIG. 21. FIG. 22 schematically illustrates a cross-section of the pixel 21b along A-A' of FIG. 20. Note that corresponding parts of FIGS. 4 to 6 are indicated by the same reference symbols.

When compared to the pixel 21a of FIGS. 4 to 6, the pixel 21b is different, in that a first wiring layer 201 is provided instead of the first wiring layer 134. When compared to the first wiring layer 134, first wiring layer 201 is different in that the upper electrode 107B and the lower electrode 107A are connected to different components.

Specifically, the upper electrodes 107B are electrically connected to the power supply 133 via a wire 201A of the first wiring layer 201 and a contact 133A. Accordingly, the upper electrodes 107B are connected to the power supply VSS side.

Furthermore, the lower electrode 107A and the node 106 are electrically connected via the contact 107D, a wire 201B of the first wiring layer 201, and the contact 106A. Accordingly, the upper electrode 107B is connected to the power supply VDD side via the node 106 and the first reset gate 104.

In other words, when the pixel 21b is compared to the pixel 21a, the power supplies connected to the upper electrodes 107B and the lower electrode 107A are reversed.

Thus, the capacitance element 107 of the pixel 21b is formed by the MIS-type or MOS-type planar type capacitor formed by the lower electrode 107A and the photoelectric conversion element 101 (N-type layer) which face each other via the insulating film 107E, in addition to the trench type capacitors in the lower electrode 107A. As a result, the capacitance of the capacitance element 107 can be increased without changing the structure of the lower electrode 107A and the upper electrodes 107B.

However, the surface portion of the photoelectric conversion element 101 is used as the electrode, so that the electric charge generated in the photoelectric conversion element 101 can hardly be transferred to the FD unit 103 via a near-surface portion of the P-type well layer 131, thus decreasing the transfer speed or transfer efficiency.

4. Third Embodiment

Figure 23:
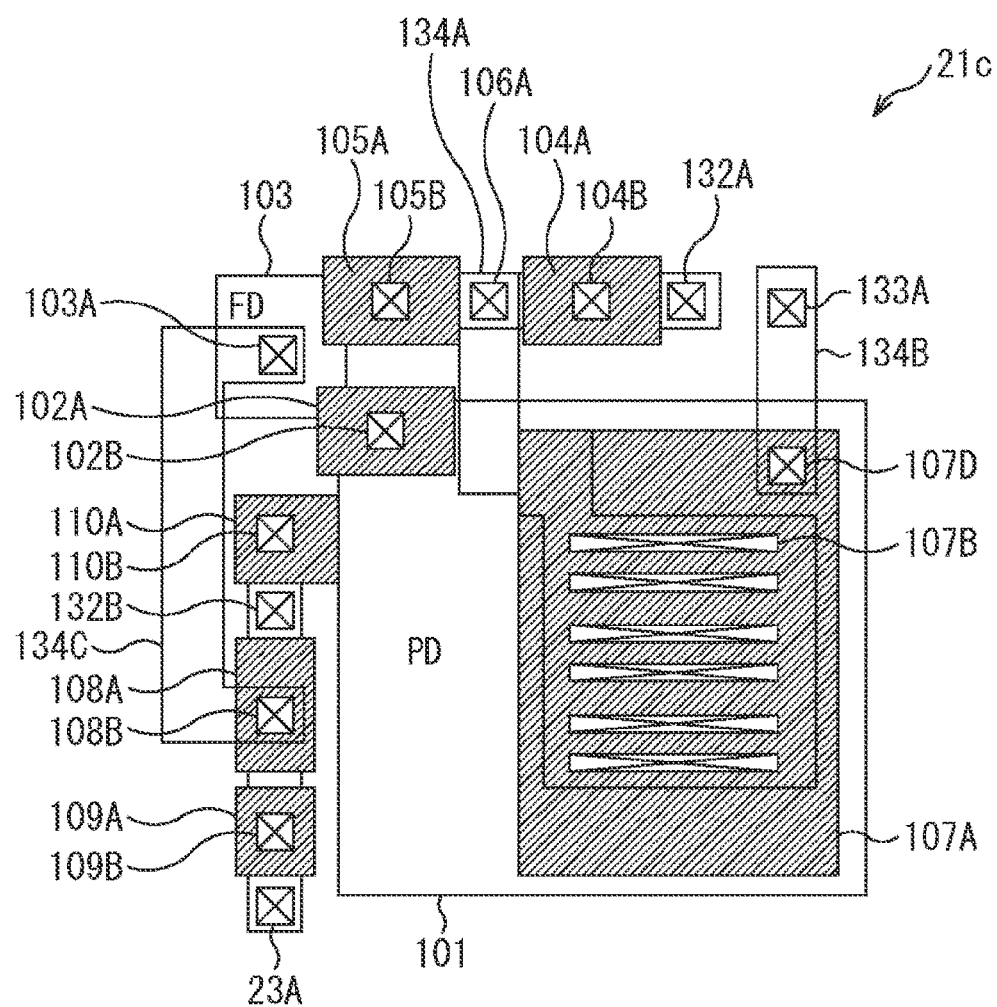
FIG. 23 is a plan view schematically illustrating a third embodiment of a pixel.

Next, a third embodiment of the present technology is described by referring to FIG. 23. FIG. 23 illustrates an exemplary structure of a pixel 21c as a third embodiment of the pixel 21 of the imaging device 10. Specifically, FIG. 23 is a plan view schematically illustrating the exemplary structure of a portion without the second wiring layer 135 and the third wiring layer 136 of the pixel 21c. Note that, in the drawing, corresponding parts of FIG. 4 are indicated by the same reference symbols.

When compared to the pixel 21a of FIG. 4, the pixel 21c is different in the shape of the trench type capacitors forming the capacitance element 107. Specifically, the trench openings of the lower electrode 107A and the cross-sections of the individual upper electrodes 107B each have a rectangular shape.

Note that the trenches having rectangular openings can also be formed using the above-described directed self assembly lithography.

5. Fourth Embodiment

Figure 24:
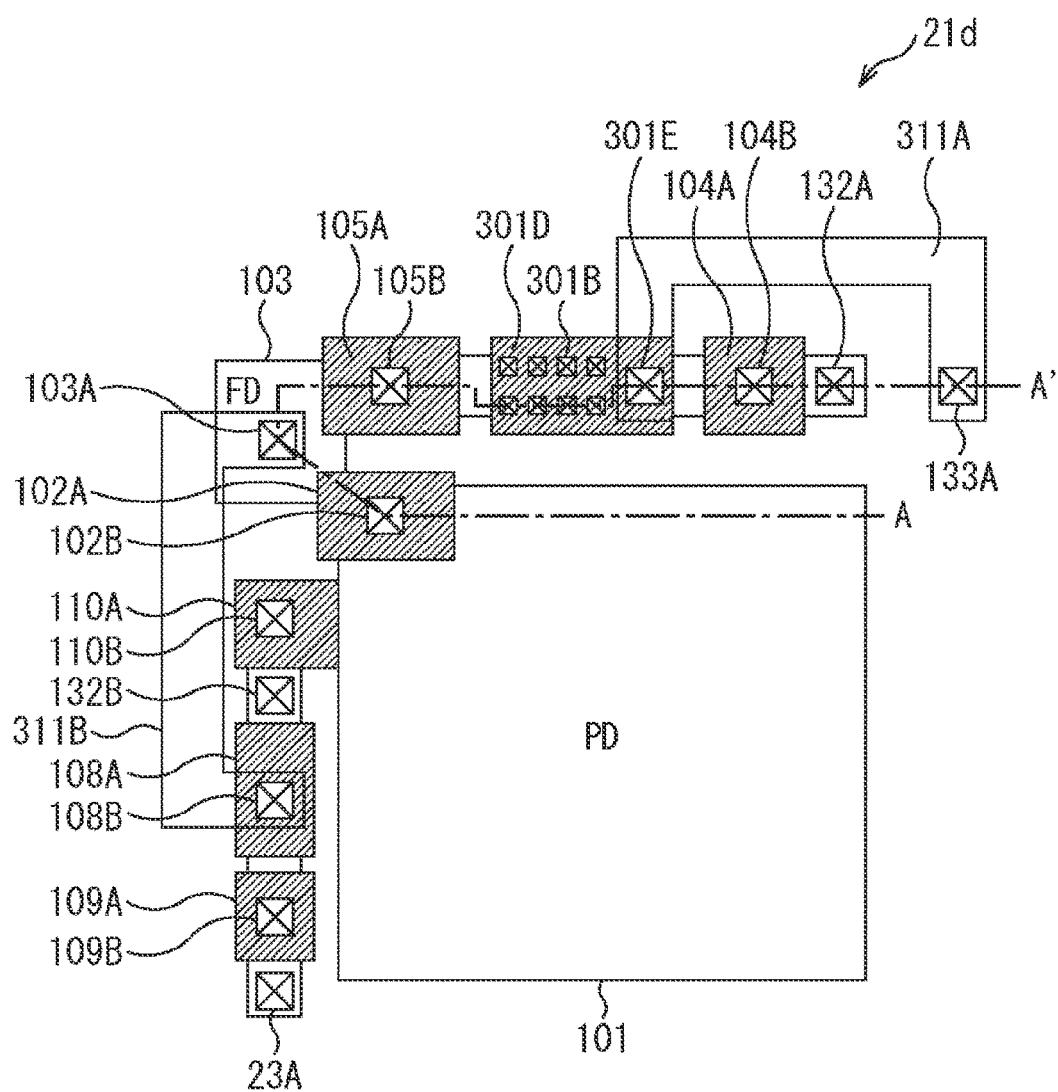
FIG. 24 is a plan view schematically illustrating a fourth embodiment of a pixel.
Figure 25:
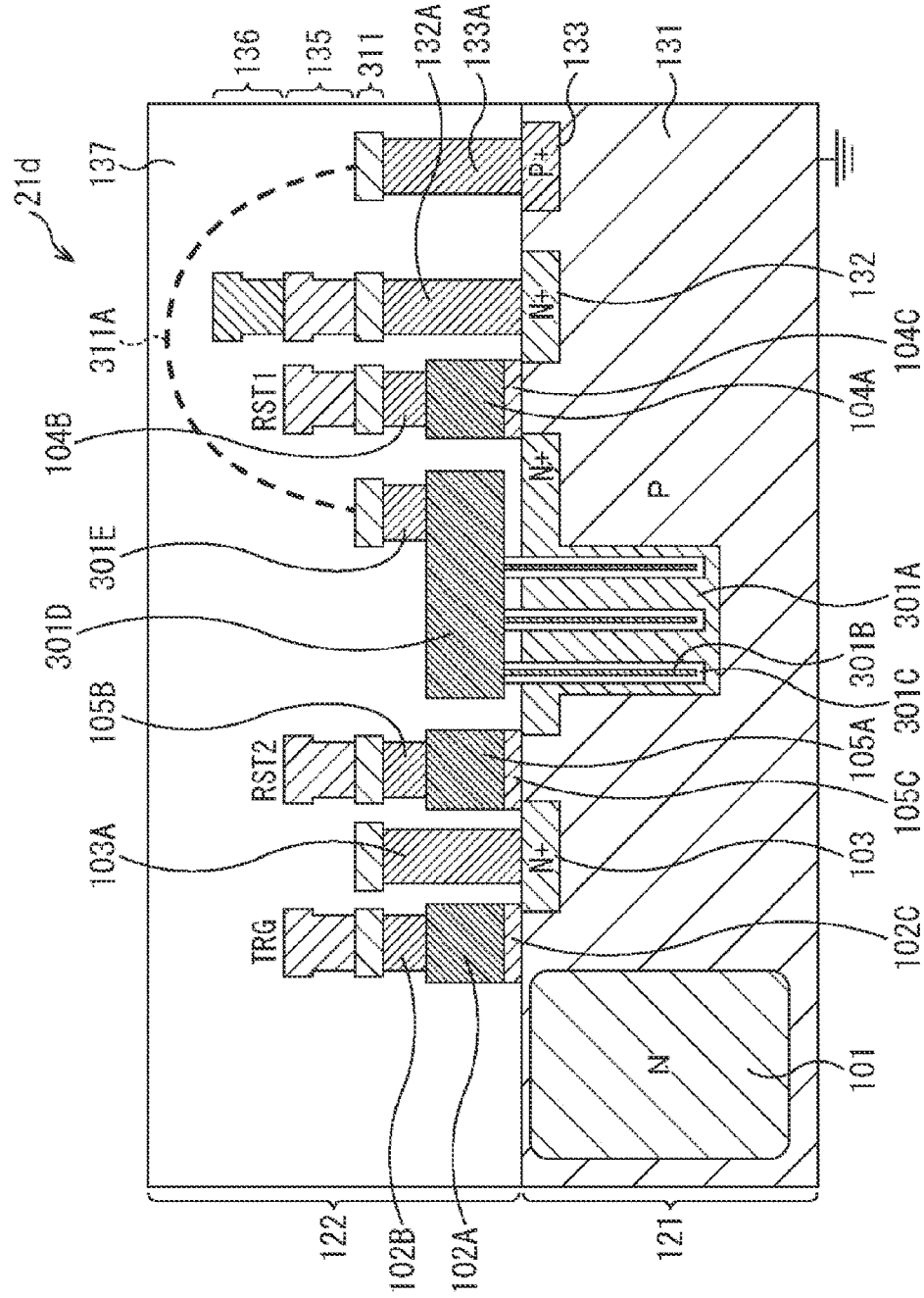
FIG. 25 is a cross-sectional view schematically illustrating the fourth embodiment of the pixel.

Next, a fourth embodiment of the present technology is described by referring to FIGS. 24 and 25.

FIGS. 24 and 25 illustrate an exemplary structure of a pixel 21d as a fourth embodiment of the pixel 21 of the imaging device 10. FIG. 24 is a plan view schematically illustrating an exemplary structure of a portion of the pixel 21d where the second wiring layer 135 and the third wiring layer 136 are eliminated. FIG. 25 schematically illustrates a cross-section of the pixel 21d along A-A' of FIG. 24. Note that corresponding parts of FIGS. 4 to 6 are indicated by the same reference symbols.

When compared to the pixel 21a of FIG. 4, the pixel 21d is different in that the capacitance element 107 is disposed in a region not vertically overlapping the photoelectric conversion element 101.

Specifically, when compared to the pixel 21a, the pixel 21d is different in that a node 301A is formed instead of the node 106, and a first wiring layer 311 is provided instead of the first wiring layer 134. Furthermore, the pixel 21d is different in that an upper electrode 301B, an insulating film 3011C, an electrode 301D, and a contact 301E are added, while the lower electrode 107A, the upper electrode 107B, the insulating film 107C, and the contact 107D are eliminated.

The node 301A includes an N+-layer formed near the surface of the P-type well layer 131. The node 301A includes a plurality of trenches formed similarly to the trenches of the lower electrode 107A of FIG. 4. The trenches of the node 301A are formed using, for example, the directed self assembly lithography, similar to the trenches of the lower electrode 107A. Furthermore, an insulating film 301C is formed on the inner surface (side wall and bottom surface) of each trench. The insulating film 301C includes, for example, a high permittivity insulating film such as a high-k material, or an oxide film.

Furthermore, the electrode 301D is disposed to almost entirely cover the upper surface of the node 301A in the wiring layer 122. Then, the plurality of upper electrodes 301B extends downward from the electrode 301D and is buried in each trench of the node 301A.

The contact 301E is connected to the upper surface of the electrode 301D. The contact 301E is connected to the contact 133A via a wire 311A of the first wiring layer 311. Accordingly, the upper electrodes 301B are electrically connected to the power supply 133 (power supply DSS) via the electrode 301D, the contact 301E, the wire 311A, and the contact 133A.

Note that the rectangular cross-section is illustrated for the contact 301E in the drawing, but the actual cross-section is substantially circular.

Furthermore, a wire 311B of the first wiring layer 311 connects the contact 103A and the contact 108B. Accordingly, the FD unit 103 and the gate electrode 108A of the amplifying transistor 108 are electrically connected via the contact 103A, the wire 311B, and the contact 108B.

Then, in the pixel 21d, a plurality of MIS-type or MOS-type trench type capacitors is formed by the region where the node 301A (lower electrode) faces the upper electrodes 301B via the insulating films 301C in the trenches of the node 301A. Then, the plurality of trench type capacitors forms the capacitance element 107 of the pixel 21d.

Note that, when the pixel 21d is compared to the pixel 21a, the capacitance element 107 is formed in the region not vertically overlapping the photoelectric conversion element 101, so that the light receiving area of the photoelectric conversion element 101 decreases. However, as described above, the capacitance element 107 includes the plurality of trench type capacitors, so that the capacitance density of the capacitance element 107 can be increased, and the installation area of the capacitance element 107 can be reduced. As a result, the reduction of the light receiving area of the photoelectric conversion element 101 and the decrease of sensitivity of the imaging device 10 can be prevented.

6. Fifth Embodiment

Figure 26:
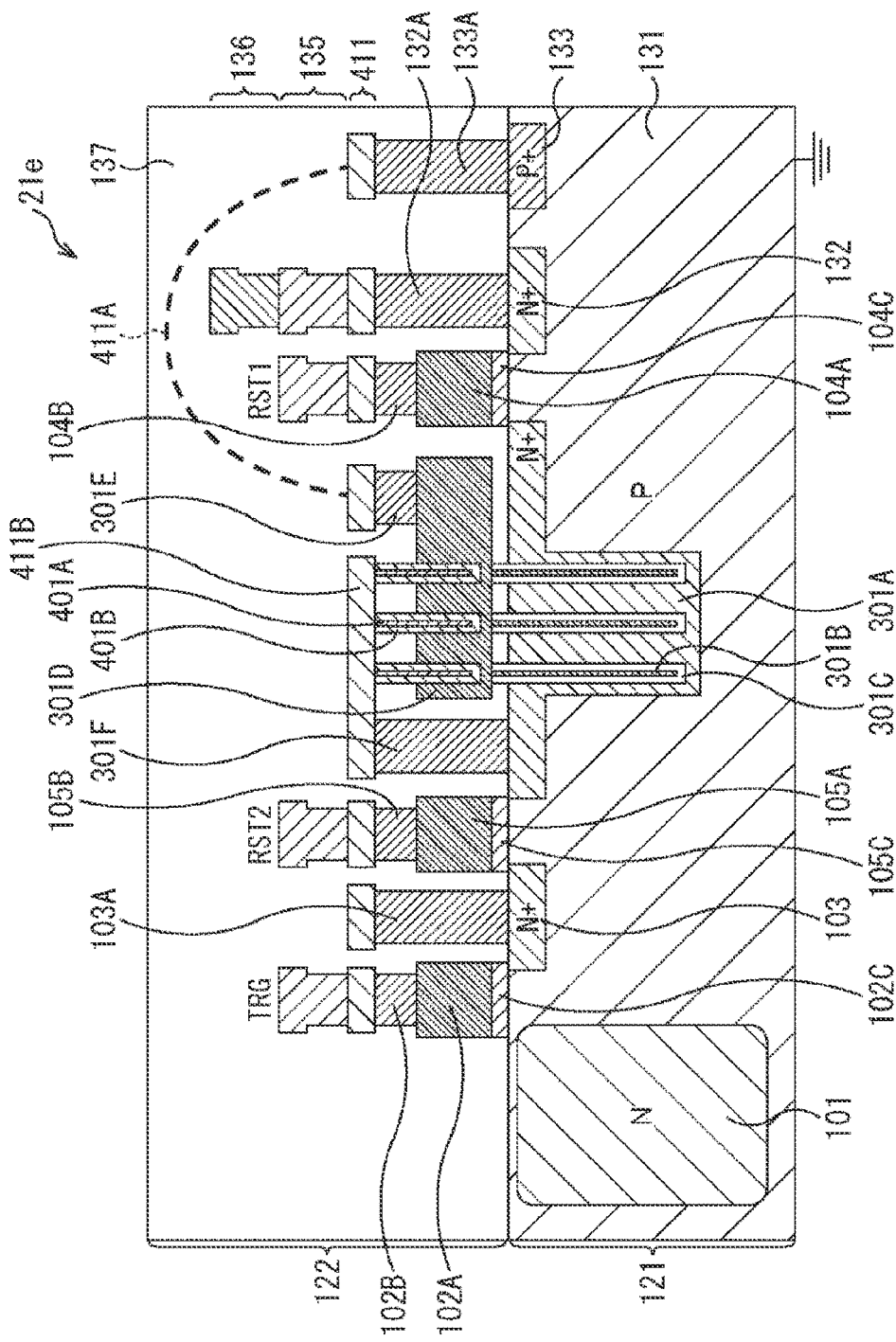
FIG. 26 is cross-sectional view schematically illustrating a fifth embodiment of a pixel.

Next, a fifth embodiment of the present technology is described by referring to FIG. 26. FIG. 26 illustrates an exemplary structure of a pixel 21e as a fifth embodiment of the pixel 21 of the imaging device 10. FIG. 26 schematically illustrates a cross-section of the pixel 21e at a position corresponding to the cross-section of the pixel 21d of FIG. 25. Note that, in the drawing, corresponding parts of FIG. 25 are indicated by the same reference symbols.

When compared to the pixel 21d, the pixel 21e is different in that a first wiring layer 411 is provided instead of the first wiring layer 311, and a contact 301F, an upper electrode 401A, and an insulating film 401B are added.

On the upper surface of the electrode 301D, a plurality of trenches formed similarly to the lower electrode 107A of FIG. 4 is formed. The trenches of the electrode 301D are formed using, for example, the directed self assembly lithography, similar to the trenches of the lower electrode 107A. Furthermore, the insulating film 401B is formed on the inner surface (side wall and bottom surface) of each trench. Moreover, the upper electrode 401A is buried in each trench of the electrode 301D.

The contact 301F is connected to the upper surface of the node 301A. The upper electrodes 401A and the node 301A are electrically connected via the wire 411B of the first wiring layer 411. Accordingly, the upper electrodes 401A are connected to the power supply VDD side via the wire 411B, the contact 301F, the node 106, and the first reset gate 104.

Furthermore, the contact 301E is connected to the contact 133A via the wire 411A of the first wiring layer 411. Accordingly, the upper electrodes 301B are connected to the power supply 133 (power supply DSS) via the electrode 301D, the contact 301E, the wire 411A, and the contact 133A.

Then, in the pixel 21e, the plurality of MIM-type or MOM-type trench type capacitors is formed by the region where the electrode 301D (lower electrode) faces the upper electrodes 401A via the insulating film 401B in the trenches of the electrode 301D. Accordingly, when the pixel 21e is compared to the pixel 21d of FIG. 26, the trench type capacitors in the electrode 301D are added to the capacitance element 107, in addition to the trench type capacitors in the node 301A, allowing further increase of the capacitance of the capacitance element 107.

7. Sixth Embodiment

Figure 27:
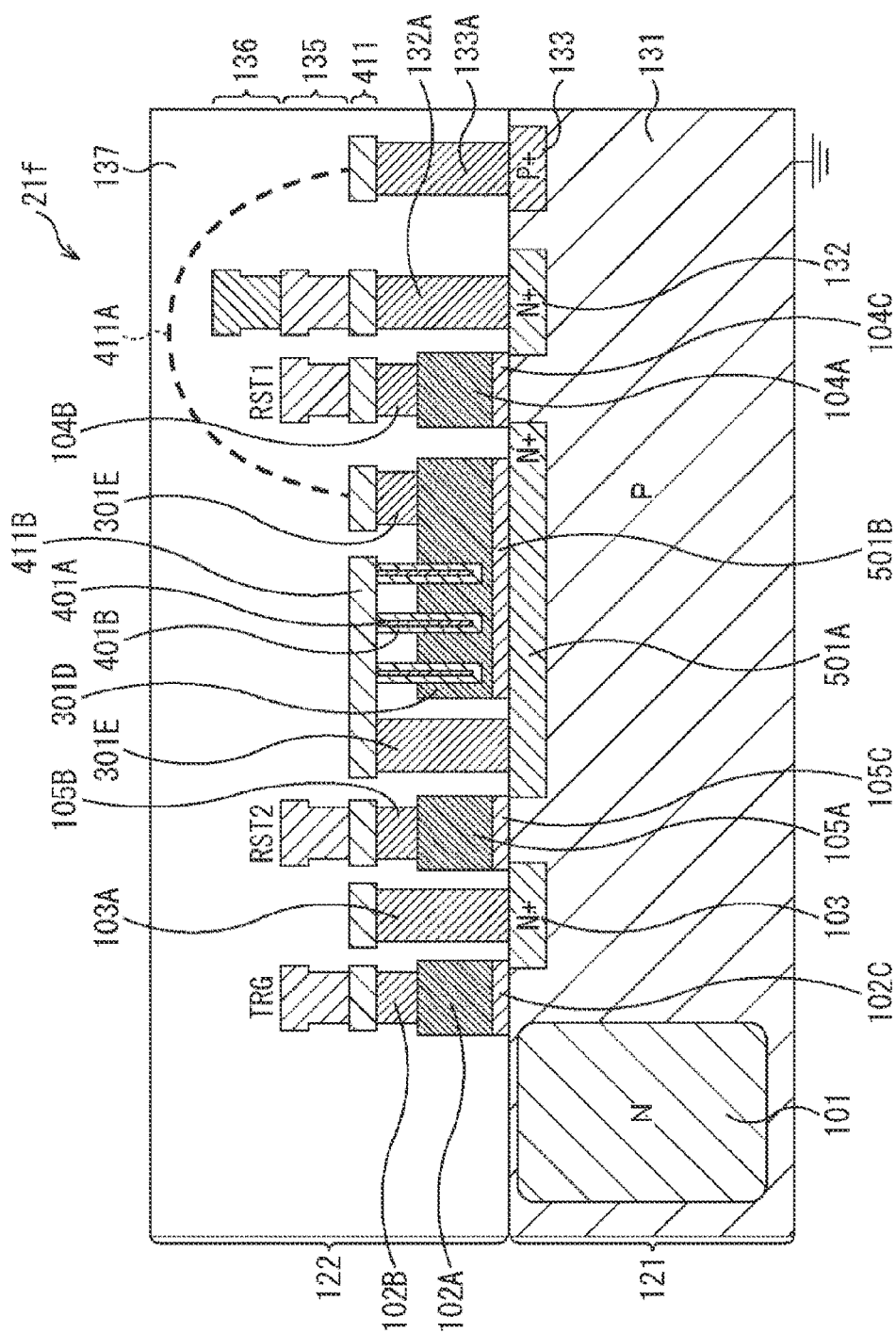
FIG. 27 is a cross-sectional view schematically illustrating a sixth embodiment of a pixel.

Next, a sixth embodiment of the present technology is described by referring to FIG. 27. FIG. 27 illustrates an exemplary structure of a pixel 21f as a sixth embodiment of the pixel 21 of the imaging device 10. FIG. 27 schematically illustrates a cross-section of the pixel 21f at a position corresponding to the cross-section of the pixel 21e of FIG. 26. Note that, in the drawing, corresponding parts of FIG. 26 are indicated by the same reference symbols.

When compared to the pixel 21e, the pixel 21f is different in that a node 501A is provided instead of the node 301A, an insulating film 501B is added, and the upper electrode 301B and the insulating film 301C are eliminated.

The node 501A includes the N+-layer formed near the surface of the P-type well layer 131. The insulating film 501B is formed between the node 501A and the electrode 301D. The insulating film 501B includes, for example, a high permittivity insulating film such as a high-k material, or an oxide film. Furthermore, the contact 301F is connected to the upper surface of the node 501A, and the node 501A is electrically connected to the upper electrode 401A via the contact 301F and the wire 411B.

Then, the MIS-type or MOS-type planar type capacitor is formed by the electrode 301D (upper electrode) and the node 501A (lower electrode) which face each other via the insulating film 501B. Accordingly, the capacitance element 107 of the pixel 21f includes the trench type capacitors in the electrode 301D and the above-described planar type capacitor. Thus, the capacitance of the capacitance element 107 can be increased.

8. Modification

A modification of the above-described embodiments of the present technology is described below.

The present technology can be applied to a backside irradiation-type imaging device including the capacitance element (e.g., a capacitance element for global shutter, a capacitance element for bandwidth limitation, or the like) that accumulates the electric charge generated by the photoelectric conversion element to be used for other than the increase of the dynamic range.

Figure 28:
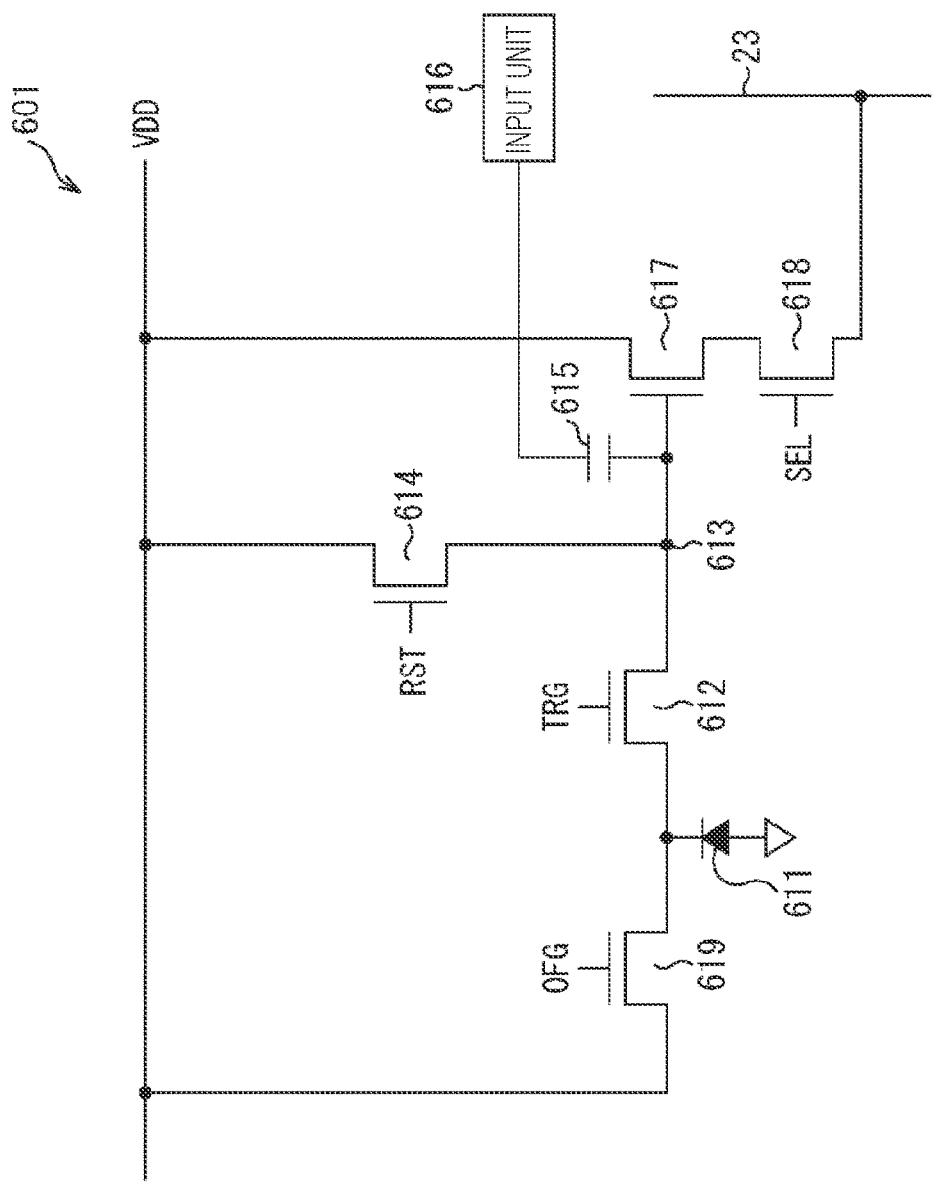
FIG. 28 is a circuit diagram illustrating a second configuration example of a pixel of the imaging device of FIG. 1.

FIG. 28 is a circuit diagram illustrating an exemplary configuration of a pixel 601 that can be used as the pixel 21 of the imaging device 10 of FIG. 1 to which the present technology is applied.

The pixel 601 includes a photoelectric conversion element 611, a transfer gate 612, an FD unit 613, a reset gate 614, a capacitance element 615, an input unit 616, an amplifying transistor 617, a selecting transistor 618, and an overflow gate 619.

Furthermore, a plurality of signal lines is arranged for the pixel 601, for example, for each pixel line as the horizontal signal lines 22 of FIG. 1. Then, the drive signals TRG, RST, SEL, and OFG are supplied from the vertical drive circuit 12 of FIG. 1 via the plurality of signal lines.

The photoelectric conversion element 611 includes, for example, a photodiode including a PN junction. The photoelectric conversion element 611 generates and accumulates the electric charge corresponding to the received light amount.

The transfer gate 612 is connected between the photoelectric conversion element 611 and the FD unit 613. The drive signal TRG is applied to the gate electrode of the transfer gate 612. When the drive signal TRG is turned on, the transfer gate 612 is turned on, and the electric charge accumulated in the photoelectric conversion element 611 is transferred to the FD unit 613 via the transfer gate 612.

The FD unit 613 converts the electric charge to a voltage signal by charge-voltage conversion and outputs the signal.

The reset gate 614 is connected between the power supply VDD and the FD unit 613. The drive signal RST is applied to the gate electrode of the reset gate 614. When the drive signal RST is turned on, the reset gate 614 is turned on, and the potential of the FD unit 613 is reset to the level of the supply voltage VDD.

The capacitance element 615 includes, for example, a capacitor. One end of the capacitance element 615 is connected to the FD unit 613, and the other end is connected to the input unit 616. The capacitance element 615 receives a control voltage for stabilization from the input unit 616. Then, the capacitance element 615 stabilizes the reset level of the pixel 601 in accordance with the control voltage.

The amplifying transistor 617 has its gate electrode connected to the FD unit 613 and its drain electrode connected to the power supply VDD, thus acting as the reading circuit for reading the electric charges held in the FD unit 613, or acting as the input unit of a so-called source follower circuit. In other words, the amplifying transistor 617 has its source electrode connected to the vertical signal line 23 via the selecting transistor 618, thus forming a source follower circuit with a constant current source (not illustrated) connected to one end of the vertical signal line 23.

The selecting transistor 618 is connected between the source electrode of the amplifying transistor 617 and the vertical signal line 23. The drive signal SEL is applied to the gate electrode of the selecting transistor 618. When the drive signal SEL is turned on, the selecting transistor 618 is turned on, and the pixel 601 enters the selectable state. Thus, the pixel signal output from the amplifying transistor 617 is output to the vertical signal line 23 via the selecting transistor 618.

The overflow gate 619 is connected between the power supply VDD and the photoelectric conversion element 611. The drive signal OFG is applied to the gate electrode of the overflow gate 619. When the drive signal OFG is turned on, the overflow gate 619 is turned on, the electric charges in the photoelectric conversion element 611 are discharged, and the photoelectric conversion element 611 is reset.

For example, the capacitance element 615 of the pixel 601 can also include the capacitance element having the configuration similar to the configuration of the above-described capacitance element 107.

Furthermore, as in the fourth to sixth embodiments, the technique to dispose the capacitance element in the region not vertically overlapping the photoelectric conversion element can be applied not only to the backside irradiation-type imaging device, but also to the surface irradiation-type imaging element.

Moreover, the pixel 21f of FIG. 27 may be configured, for example, by eliminating the planar type capacitor including the electrode 301D (upper electrode) and the node 501A (lower electrode) which face each other via the insulating film 501B.

Furthermore, the lower electrode 107A of FIG. 6 may not necessarily be disposed in the same layer as the gate electrode in the pixel, and may be disposed, for example, in other layers of the wiring layer 122.

Moreover, the lower electrode 107A of FIG. 6 and the electrode 301D of FIG. 25 may include, for example, a conductive member other than polysilicon.

Furthermore, the trench type capacitors that form the above-described capacitance element 107 can be formed, for example, in a vacant region of the gate electrode of the transistor in the pixel.

Moreover, the directed self assembly lithography may not necessarily be used, for example, to form the trench type capacitors that form the capacitance element 107, and may be used as necessary.

9. Application Example of Imaging Device

Usage Example of Imaging Device

Figure 29:
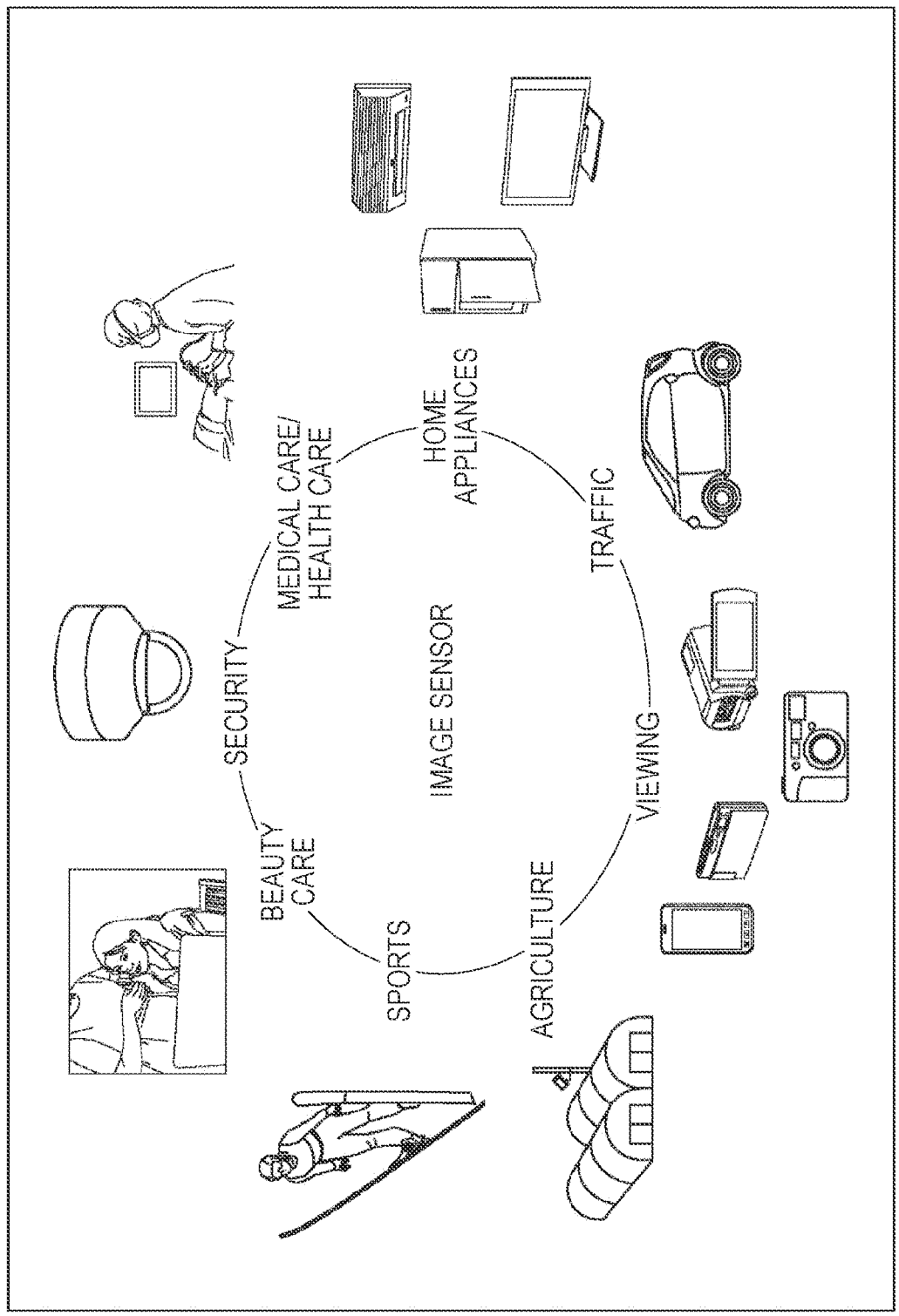
FIG. 29 is a usage example of a solid state imaging device.

FIG. 29 is a usage example of the above-described imaging device.

The imaging device described above can be used, for example, in various occasions as described below for sensing light, such as visible light, infrared light, ultraviolet light, or X-rays.

A device for shooting images for ornamental use, such as a digital camera and a portable device with camera function.

A device used for traffic, such as an on-board sensor for shooting the front and rear, surroundings, interior, or the like of a car, a monitoring camera for monitoring running vehicles and road conditions, or a distance measuring sensor measuring the distance between vehicles, to achieve safety driving such as automatic stopping and recognize the condition of a driver.

A device used for home appliances, such as a TV, a refrigerator, or an air-conditioner, to shoot gestures of a user and operate the device in accordance with the gestures.

A device used for medical care or health care, such as an endoscope or an angiography device which operates by receiving infrared light.

A device used for security, such as a monitoring camera for crime prevention or a camera for personal authentication.

A device for beauty care, such as a skin analyzer for shooting the skin or a microscope for shooting scalp.

A device used for sports, such as an action camera or a wearable camera used in sports or the like.

A device used for agriculture, such as a monitoring camera for monitoring fields and conditions of crops.

Example of Applying Imaging Device to Electronic Device

Figure 30:
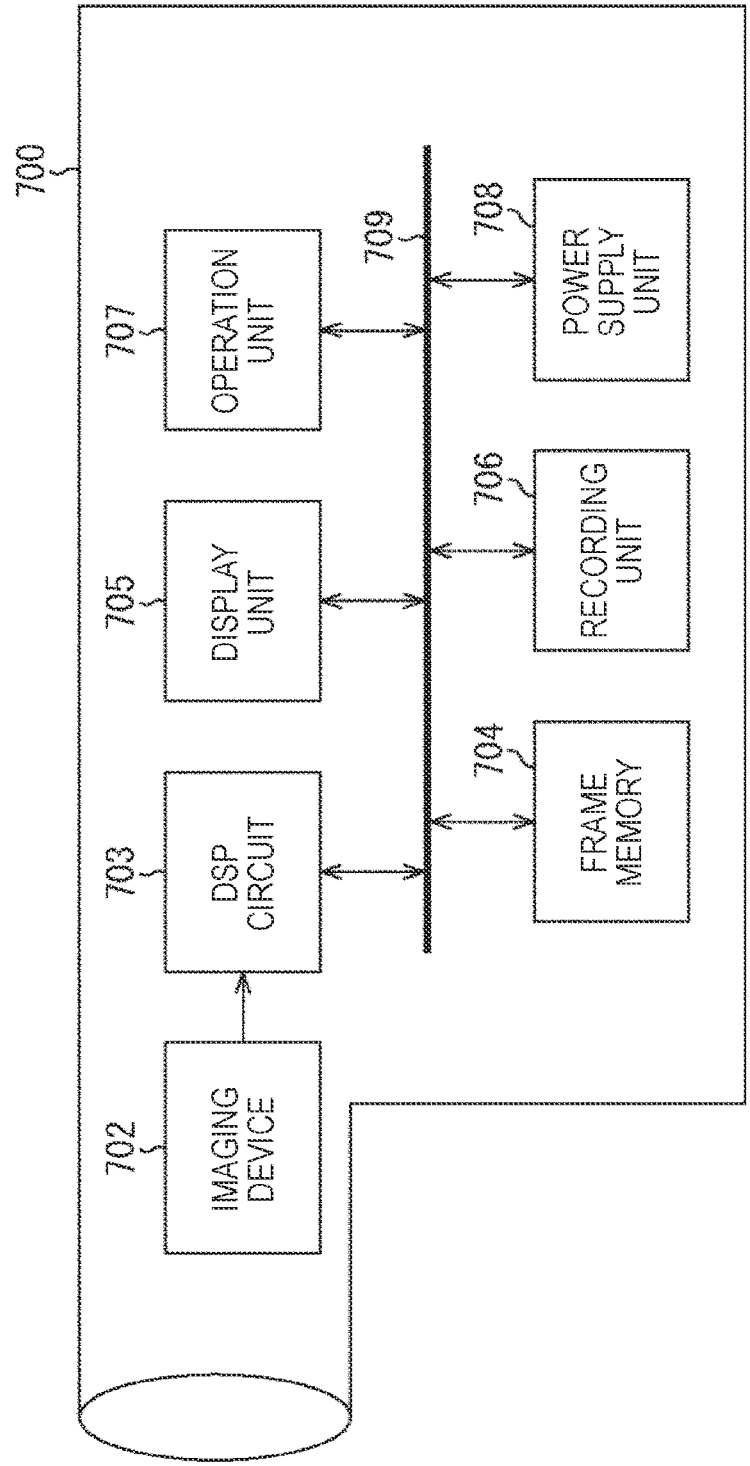
FIG. 30 is a block diagram illustrating an exemplary structure of an electronic device.

FIG. 30 is an exemplary structure of an electronic device 700 to which the imaging device is applied.

The electronic device 700 is an electrical device of, for example, an imaging device such as a digital still camera or a video camera, or a mobile terminal device such as a smartphone or a tablet terminal.

In FIG. 30, the electronic device 700 includes a lens 701, an imaging device 702, a DSP circuit 703, a frame memory 704, a display unit 705, a recording unit 706, an operation unit 707, and a power supply unit 708. Furthermore, in the electronic device 700, the DSP circuit 703, the frame memory 704, the display unit 705, the recording unit 706, the operation unit 707, and the power supply unit 708 are connected with each other via a bus line 709.

Then, the imaging device 702 can be implemented by the imaging device 10 of FIG. 1.

The DSP circuit 703 is a signal processing circuit that processes a signal supplied from the imaging device 702. The DSP circuit 703 outputs image data obtained by processing the signal from the imaging device 702. The frame memory 704 temporarily holds the image data for each frame processed by the DSP circuit 703.

The display unit 705 includes, for example, a panel type display unit, such as a liquid crystal panel or an electro luminescence (EL) panel, to display moving images or still images taken by the imaging device 702. The recording unit 706 records image data of moving images or still images taken by the imaging device 702 in a recording medium, such as a semiconductor memory or a hard disk.

The operation unit 707 outputs an operation instruction regarding various functions of the electronic device 700 in accordance with the operation by a user. The power supply unit 708 supplies various kinds of power being an operation power source of the DSP circuit 703, the frame memory 704, the display unit 705, the recording unit 706, and the operation unit 707 to these supply targets, as appropriate.

Note that the embodiment of the present technology is not limited to the above-described embodiments, and various changes may be made without departing from the spirit of the present technology.

Furthermore, for example, the following configurations are also possible for the present technology.

(1) An imaging device, including, in a pixel,
   a photoelectric conversion element, and
   a capacitance element configured to accumulate an electric charge generated by the photoelectric conversion element, in which
   the capacitance element includes
   a first electrode in which a plurality of first trenches are formed,
   a plurality of second electrodes each having a cross-sectional area smaller than a contact connected to a gate electrode of a transistor in the pixel and buried in each of the first trenches, and
   a first insulating film disposed between the first electrode and the second electrode in each of the first trenches.

(2) The imaging device as recited in (1) above, in which the first electrode is disposed at a position vertically overlapping the photoelectric conversion element in a wiring layer disposed opposite to an incidence surface side of the photoelectric conversion element.

(3) The imaging device as recited in (2) above, in which the first electrode is connected to a negative power supply side of the pixel, and each of the second electrodes is connected to a positive power supply side of the pixel.

(4) The imaging device as recited in (2) above, in which the first electrode is connected to a positive power supply side of the pixel, and each of the second electrodes is connected to a negative power supply side of the pixel.

(5) The imaging device as recited in (1) above, in which the first electrode is disposed at a position not vertically overlapping the photoelectric conversion element.

(6) The imaging device as recited in (5) above, in which the first electrode is disposed in a semiconductor substrate in which the photoelectric conversion element is disposed.

(7) The imaging device as recited in (6) above, in which the capacitance element further includes
   a third electrode including a plurality of second trenches, disposed at a position vertically overlapping the first electrode in a wiring layer stacked in the semiconductor substrate, and electrically connected to each of the second electrodes,
   a plurality of fourth electrodes each having a cross-sectional area smaller than the contact, buried in each of the second trenches, and electrically connected to the first electrode, and
   a second insulating film disposed between the third electrode and the fourth electrode in each of the second trenches.

(8) The imaging device as recited in (5) above, in which the first electrode is disposed in a wiring layer.

(9) The imaging device as recited in (8) above, further including:
   a third electrode disposed at a position vertically overlapping the first electrode and electrically connected to each of the second electrodes in a semiconductor substrate in which the photoelectric conversion element is disposed; and
   a second insulating film disposed between the first electrode and the second electrode.

(10) The imaging device as recited in any one of (1) to (9) above, in which a total area of a portion in which each of the second electrodes faces the first electrode is larger than an area of a region where the second electrodes are disposed in the first electrode.

(11) The imaging device as recited in any one of (1) to (10) above, in which each of the first trenches is formed by directed self assembly lithography.

(12) A method of manufacturing an imaging device, the method including:
   a first electrode forming step of forming a first electrode in a pixel;
   a trench forming step of forming a plurality of trenches in the first electrode, each trench having an opening area smaller than an opening area of a trench for forming a contact connected to a gate electrode of a transistor in the pixel;
   an insulating film forming step of forming an insulating film on an inner surface of each of the trenches; and a second electrode forming step of burying a second electrode in each of the trenches.

(13) The method of manufacturing an imaging device as recited in (12) above, in which
   in the first electrode forming step, the first electrode is formed at a position vertically overlapping the photoelectric conversion element in a wiring layer disposed opposite to an incidence surface side of the photoelectric conversion element in the pixel.

(14) The method of manufacturing an imaging device as recited in (12) above, in which
   in the first electrode forming step, the first electrode is formed at a position not vertically overlapping the photoelectric conversion element in the pixel.

(15) The method of manufacturing an imaging device as recited in (14) above, in which
   in the first electrode forming step, the first electrode is formed in a semiconductor substrate in which the photoelectric conversion element is disposed.

(16) The method of manufacturing an imaging device as recited in (14) above, in which
   in the first electrode forming step, the first electrode is formed in a wiring layer.

(17) The method of manufacturing an imaging device as recited in any one of (12) to (16), in which
   a total area of a portion in which each of the second electrodes faces the first electrode is made to be larger than an area of a region where the second electrodes are disposed in the first electrode.

(18) The method of manufacturing an imaging device as recited in any of (12) to (17) above,
   in the trench forming step, each of the trenches is formed by directed self assembly lithography.

(19) An electronic device, including
   an imaging device, and
   a signal processing unit configured to process a signal output from the imaging device, in which
   the imaging device includes, in a pixel,
   a photoelectric conversion element, and a capacitance element configured to accumulate an electric charge generated by the photoelectric conversion element, and the capacitance element includes a first electrode in which a plurality of first trenches are formed, a plurality of second electrodes each having a cross-sectional area smaller than a contact connected to a gate electrode of a transistor in the pixel and buried in each of the trenches, and a first insulating film disposed between the first electrode and the second electrode in each of the trenches.

REFERENCE SIGNS LIST

10 Imaging device
11 Pixel region
21, 21a to 21f Pixel
23A Contact
101 Photoelectric conversion element
102A Gate electrode
102B Contact
103A Contact
104A Gate electrode
104B Contact
105A Gate electrode
105B Contact
106 Node
106A Contact
107 Capacitance element
107A Lower electrode
107B Upper electrode
107C Insulating film
107D Contact
107E Insulating film
108A Gate electrode
108B Contact
109A Gate electrode
109B Contact
110A Gate electrode
110B Contact
121 Semiconductor substrate
122 Wiring layer
132 Power supply
132A, 132B Contact
133 Power supply
133A Contact
134A to 134C Wire
137 Interlayer insulating film
137A to 137I Trench
151 Photoresist
151A Opening
152 Polymer
201A to 201C Wire
301A Node
301B Upper electrode
301C Insulating film
301D Electrode
301E, 301F Contact
311A, 311B Wire
401A Upper electrode
401B Insulating film
411A, 411B Wire
501A Node
501B Insulating film
601 Pixel
611 Photoelectric conversion element
615 Capacitance element
700 Electronic device
702 Imaging device

What is claimed is:

1. A light detecting device, comprising:
a pixel that comprises:
a photoelectric conversion element;
a capacitance element configured to accumulate a charge from the photoelectric conversion element, wherein
the capacitance element includes:
a plurality of trenches, wherein each trench of the plurality of trenches includes a first electrode and a first insulating layer; and
a second electrode coupled to an input unit, wherein the first insulating layer of each of the plurality of trenches is between the first electrode of each of the plurality of trenches and the second electrode, and
the capacitance element overlaps the photoelectric conversion element;
a wiring layer including:
a third electrode connected to the first electrode of each of the plurality of trenches, and
a fourth electrode configured to receive a fixed potential;
a second insulating layer between the second electrode and the photoelectric conversion element, wherein the second electrode is on an entire length of the second insulating layer;
a reset gate between the fixed potential and a node connected to the capacitance element; and
a transistor that includes:
a gate electrode connected to the node connected to the capacitance element, and
a drain electrode connected to the fixed potential.

2. The light detecting device according to claim 1, wherein the fixed potential is a positive power supply (VDD).

3. The light detecting device according to claim 1, wherein the capacitance element is between the wiring layer and the photoelectric conversion element.

4. The light detecting device according to claim 1, wherein the first insulating layer of each of the plurality of trenches includes one of zirconium oxide ($ZrO_2$) or aluminum oxide ($Al_2O_3$).

5. The light detecting device according to claim 1, wherein each trench of the plurality of trenches has a cross-sectional area smaller than a cross-sectional area of a contact connected to the fourth electrode.

6. The light detecting device according to claim 5, wherein the cross-sectional area of each trench of the plurality of trenches is circular.

7. The light detecting device according to claim 5, wherein the contact includes tungsten (W).

8. The light detecting device according to claim 1, wherein the wiring layer is opposite to an incidence surface side of the photoelectric conversion element.

9. The light detecting device according to claim 1, wherein the second electrode includes the plurality of trenches.

10. The light detecting device according to claim 9, wherein a total area of a portion in which the first electrode of each of the plurality of trenches faces the second electrode is larger than an area of a region where the first electrode of each of the plurality of trenches is disposed in the second electrode.

\* \* \* \* \*